US012720688B2

(12) United States Patent
Ahn et al.

(10) Patent No.: US 12,720,688 B2
(45) Date of Patent: Aug. 25, 2026

(54) ATTACHMENT STRUCTURE OF FLEXIBLE DISPLAY IN ELECTRONIC DEVICE

(71) Applicant: Samsung Electronics Co., Ltd., Suwon-si (KR)

(72) Inventors: Sungho Ahn, Suwon-si (KR); Hyunju Hong, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 172 days.

(21) Appl. No.: 17/942,391

(22) Filed: Sep. 12, 2022

(65) Prior Publication Data

US 2023/0007796 A1 Jan. 5, 2023

Related U.S. Application Data

(63) Continuation of application No. PCT/KR2021/016047, filed on Nov. 5, 2021.

(30) Foreign Application Priority Data

Nov. 6, 2020 (KR) ........................ 10-2020-0147942
Jan. 4, 2021 (KR) ........................ 10-2021-0000555

(51) Int. Cl.
*H05K 5/00* (2025.01)
*H04M 1/02* (2006.01)
*H05K 5/02* (2006.01)

(52) U.S. Cl.
CPC ........ *H05K 5/0217* (2013.01); *H04M 1/0237* (2013.01); *H04M 1/0268* (2013.01)

(58) Field of Classification Search
None
See application file for complete search history.

(56) References Cited

U.S. PATENT DOCUMENTS 11,647,597 B2 * 5/2023 Liu ..................... H04M 1/0235 361/807
11,914,423 B2 * 2/2024 Shin .................... H04M 1/0268
(Continued)

FOREIGN PATENT DOCUMENTS

JP 4713845 6/2011
JP 6151253 6/2017
(Continued)

OTHER PUBLICATIONS

International Search Report for PCT/KR2021/016047 dated Feb. 25, 2022, 4 pages.
(Continued)

*Primary Examiner* — Imani N Hayman
*Assistant Examiner* — Rashen E Morrison
(74) *Attorney, Agent, or Firm* — NIXON & VANDERHYE P.C.

(57) ABSTRACT

According to various embodiments of the disclosure, an electronic device may include: a housing, a flexible display, and a roller unit. The flexible display may include a first portion, a second portion extending from the first portion in a first direction, and a third portion extending from the second portion. The second portion may be drawn into the inside of a first housing by sliding of a second housing in the first direction when the electronic device is converted from a second state to a first state, and may be drawn out from the inside of the first housing by sliding of the second housing in a second direction opposite to the first direction when the electronic device is converted from the first state to the second state. The third portion may be fixed to a flat region of the third section in the first state.

17 Claims, 46 Drawing Sheets

(56) References Cited

U.S. PATENT DOCUMENTS

| | | | | |
|---|---|---|---|---|
| 2015/0115229 | A1 | 4/2015 | Jung | |
| 2016/0202781 | A1 | 7/2016 | Kim et al. | |
| 2016/0209970 | A1 | 7/2016 | Lee | |
| 2017/0064847 | A1 | 3/2017 | Lim | |
| 2018/0103551 | A1* | 4/2018 | Park | G09F 9/301 |
| 2019/0098774 | A1* | 3/2019 | Park | H05K 5/0217 |
| 2019/0305237 | A1 | 10/2019 | Shin et al. | |
| 2020/0264660 | A1 | 8/2020 | Song et al. | |
| 2020/0363841 | A1 | 11/2020 | Kim et al. | |
| 2020/0396850 | A1* | 12/2020 | Kim | H05K 5/0217 |
| 2020/0409421 | A1 | 12/2020 | Cho et al. | |
| 2021/0135151 | A1 | 5/2021 | Baek et al. | |
| 2021/0195008 | A1* | 6/2021 | Lee | G06F 1/1652 |
| 2021/0240294 | A1* | 8/2021 | Ko | G06F 3/0416 |

FOREIGN PATENT DOCUMENTS

| | | | | | |
|---|---|---|---|---|---|
| KR | 10-2015-0047936 | | | 5/2015 | |
| KR | 10-2016-0087460 | | | 7/2016 | |
| KR | 10-2016-0127220 | | | 11/2016 | |
| KR | 10-2016-0141255 | | | 12/2016 | |
| KR | 10-2019-0062855 | | | 6/2019 | |
| KR | 10-2019-0091711 | | | 8/2019 | |
| KR | 10-2019-0101184 | | | 8/2019 | |
| KR | 10-2019-0106322 | | | 9/2019 | |
| KR | 20190106322 | A | * | 9/2019 | H04M 1/0268 |
| KR | 10-2019-0113128 | | | 10/2019 | |
| KR | 10-2020-0075363 | | | 6/2020 | |
| KR | 20200075363 | A | * | 6/2020 | G09F 9/301 |
| KR | 10-2020-0099455 | | | 8/2020 | |
| KR | 10-2020-0117741 | | | 10/2020 | |
| KR | 10-2022-0117330 | | | 8/2022 | |

OTHER PUBLICATIONS

Written Opinion of the ISA for PCT/KR2021/016047 dated Feb. 25, 2022, 4 pages.

Korean Office Action dated Jun. 26, 2025 for KR Application No. 10-2021-0000555.

Notice of Patent Grant for KR Application No. 10-2021-0000555 dated Feb. 25, 2026 and English translation, 4 pages.

* cited by examiner

ATTACHMENT STRUCTURE OF FLEXIBLE DISPLAY IN ELECTRONIC DEVICE

CROSS-REFERENCE TO RELATED APPLICATIONS

This application is a continuation of International Application No. PCT/KR2021/016047 designating the United States, filed on Nov. 5, 2021, in the Korean Intellectual Property Receiving Office and claiming priority to Korean Patent Application No. 10-2020-0147942, filed on Nov. 6, 2020, in the Korean Intellectual Property Office and Korean Patent Application No. 10-2021-0000555, filed on Jan. 4, 2021, in the Korean Intellectual Property Office, the disclosures of all of which are incorporated by reference herein in their entireties.

BACKGROUND

Field

The disclosure relates to an attachment structure of a flexible display in an electronic device.

Description of Related Art

With the advance of display technology, there is ongoing development on various types of display devices. In particular, display devices such as a computer, a tablet Personal Computer (PC), a mobile phone, or the like have a high distribution rate, and efforts have been recently made to develop a new form of the display device in order to meet the needs of users who want newer and more diverse functions.

As a result of such efforts, a rollable display device is an example of a next-generation display device. A portable electronic device employs a display having a larger area, compared to a housing, to provide a wide screen. However, since the electronic device increases in size in proportion to an increase in a size of the display, there is a limit in the size of the display. In order to overcome the limitation, in the next-generation display device, e.g., the rollable display, part of the display may be selectively drawn into the inside of the housing.

A type of the display includes a bar type, a foldable type, and a rollable type. In case of the bar type, although the display is attached to part of a curved portion, since a window layer of the display is fixed in a bended shape, the display may be stably attached to the housing of the electronic device. In case of the foldable type, a folding portion of the display may not be attached to the housing of the electronic device, but at least part of a flat portion of the display may be attached to the housing of the electronic device.

In case of a rollable display, there is a state in which part of the display is drawn into the inside of a housing (hereinafter, referred to as a first state) and a state in which part of the display is drawn out from the inside of the housing (hereinafter, referred to as a second state). The rollable display includes a roller unit which enables the display to move. A movement section of the rollable display has a curved section, in which the display moves by being bended along the roller unit, and a flat section. when the electronic device is converted from the first state to the second state, an end of the rollable display located in the flat section when the rollable display is in the first state is located in the curved section, thereby repeatedly applying a stress to the end of the rollable display. Since the stress is repeatedly applied to the end of the rollable display and repelling force increases due to an increase in rigidity of the display, the end of the rollable display may be lifted off.

SUMMARY

Embodiments of the disclosure may provide a device which prevents and/or reduces a rollable display from being lifted off.

According to various example embodiments of the disclosure, an electronic device may include: a housing including a first housing including a side surface and rear surface of the electronic device and a second housing coupled to the first housing in a slidable manner within a specified range, a flexible display including at least one region viewed from the outside of the electronic device through a front surface of the electronic device, and a roller unit including a roller disposed inside the housing. The flexible display may be movable along a first section corresponding to a front surface of the electronic device, a second section extending from the first section and surrounding the roller unit, and a third section extending from the second section to the inside of the housing. The flexible display may include a first portion, a second portion extending from the first portion in a first direction, and a third portion extending from the second portion. The second portion may be drawn into the inside of the first housing by sliding of the second housing in the first direction when the electronic device is converted from a second state to a first state, and may be drawn out from the inside of the first housing by sliding of the second housing in a second direction opposite to the first direction when the electronic device is converted from the first state to the second state. The third portion may be fixed to a flat region of the third section in the first state.

According to various example embodiments of the disclosure, an electronic device may include: a housing including a first housing including a side surface and rear surface of the electronic device and a second housing coupled to the first housing in a slidable manner within a specified range, a flexible display having at least one region viewed from the outside of the electronic device through a front surface of the electronic device, a fastener, and a roller unit comprising a roller disposed inside the housing. The flexible display may be movable along a first section corresponding to a front surface of the electronic device, a second section extending from the first section and surrounding the roller unit, and a third section extending from the second section to the inside of the housing. The flexible display may include a first portion, a second portion extending from the first portion in a first direction, and a third portion extending from the second portion. The second portion may be drawn into the inside of the first housing by sliding of the second housing in the first direction when the electronic device is converted from a second state to a first state, and may be drawn out from the inside of the first housing by sliding of the second housing in a second direction opposite to the first direction when the electronic device is converted from the first state to the second state. The third portion may be fixed by being connected to a fastener in a flat region of the third section in the first state, may include a dummy region in at least one region, and may include at least one adhesive layer.

According to various example embodiments disclosed in the disclosure, since an end of a rollable display is fixed in a flat section in a second state in which part of the display is drawn out from the inside of a housing, the end of the rollable display can be prevented from and/or avoid being lifted off.

In addition, according to various example embodiments, even if a transition is made from a first state in which part of the display is drawn into the inside of a housing to the second state and the rollable display moves along the flat section and a curved section, at least one region of the rollable display can be fixed by being located in the flat section.

In addition, according to various example embodiments, a slit or segmented structure may be constructed in some layers among a plurality of layers of the rollable display, thereby reducing frictional force.

In addition, according to various example embodiments, since a fixing member is connected to the end of the rollable display located in the flat section in the second state, the end of the rollable display can be prevented from and/or avoid being lifted off.

In addition, according to various example embodiments, since a pressing member and the fixing member are connected to the end of the rollable display located in the flat section in the second state, the end of the rollable display can be prevented from and/or avoid being lifted off.

In addition, according to various example embodiments, some of layers of the display, of the end of the rollable display, may be replaced with an adhesive layer including an adhesive member, and are fixed to the flat section, thereby preventing and/or avoiding the end of the rollable display from being lifted off.

In addition thereto, various effects which are directly or indirectly understood through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments of the disclosure are described with reference to the accompanying drawings. However, it should be appreciated that this is not intended to limit the technological features set forth herein to particular embodiments and include various changes, equivalents, or replacements for an embodiment of the disclosure.

Figure 1A:
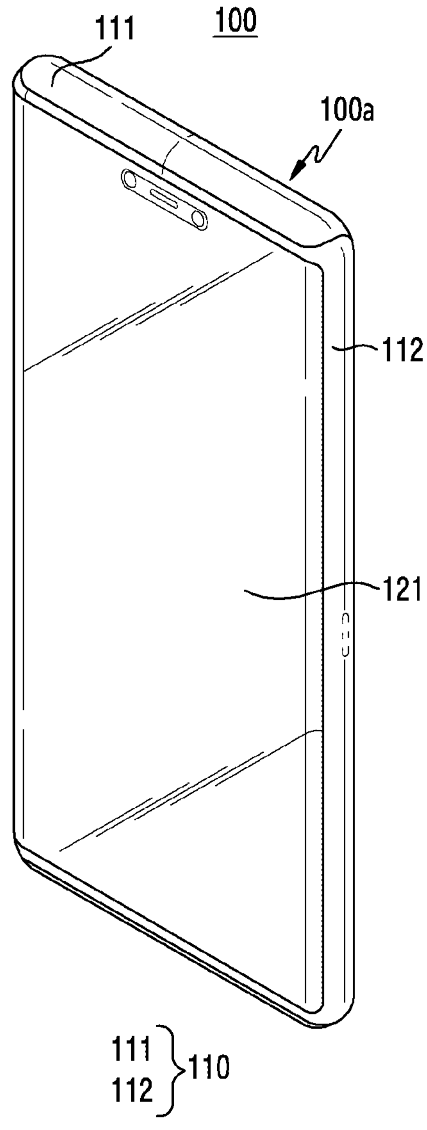
FIG. 1A is a front perspective view of an electronic device in a first state according to various embodiments.

FIG. 1A is a front perspective view of an electronic device in a first state according to various embodiments.

Figure 1B:
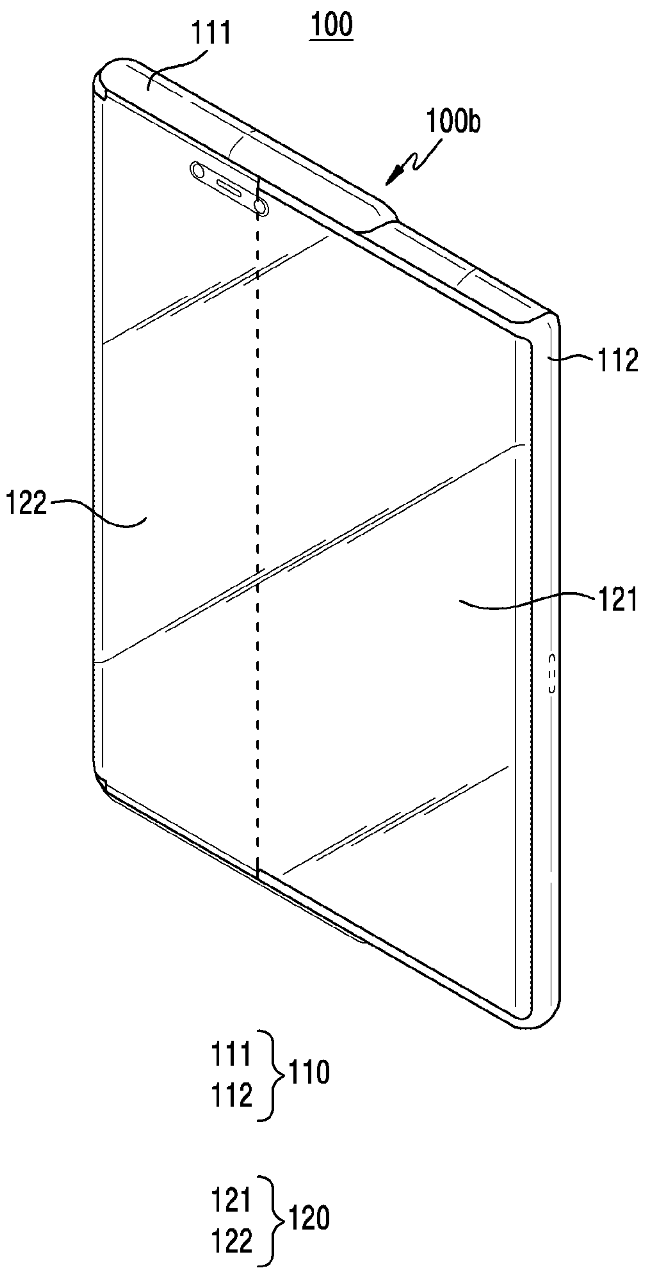
FIG. 1B is a front perspective view of an electronic device in a second state according to various embodiments.

FIG. 1B is a front perspective view of an electronic device in a second state according to various embodiments.

Referring to FIG. 1A and FIG. 1B, a display 120 may be located on one face of an electronic device 100 according to an embodiment. Hereinafter, a face on which the display 120 is located is referred to as a front surface. According to an embodiment, the display 120 may occupy most of the front surface of the electronic device 100. According to an embodiment, the display 120 may include a flat shape and a curved shape. The display 120 and a housing 110 surrounding at least part of an edge of the display 120 may be disposed to the front surface of the electronic device 100. According to an embodiment, the housing 110 may form a side surface, a rear surface, and a partial region of the front surface of the electronic device 100. According to an embodiment, the housing 110 may form the rear surface and a partial region of the side surface of the electronic device 100. According to an embodiment, the housing 110 may include a first housing 111 and a second housing 112 movable with respect to the first housing 111.

The electronic device 100 according to an embodiment may include a first state 100*a* and a second state 100*b*. For example, the first state 100*a* and second state 100*b* of the electronic device 100 may be determined according to a relative location of the second housing 112 with respect to the first housing 111, and the electronic device 100 may be configured to be changeable in shape between the first state 100*a* and the second state 100*b* due to a user's manipulation and a mechanical operation.

According to an embodiment, the display 120 may include a first portion 121 that can be connected to the second housing 112 and a second portion 122 that can be drawn into the inside of the electronic device 100 by extending from the first portion 121. According to an embodiment, when the electronic device 100 transitions from the first state 100*a* to the second state 100*b* with the movement of the second housing 112, the second portion 122 of the display 120 may be drawn out from the inside of the electronic device 100 to the outside. According to an embodiment, when the electronic device 100 transitions from the second state 100*b* to the first state 100*a* with the movement of the second housing 112, the second portion 122 of the display 120 may be drawn into the inside of the electronic device 100.

According to an embodiment, the display 120 may emit light from a pixel to transfer information to a user, and the light emitted from the pixel may be transferred to the outside of the electronic device 100 through the display 120. In an embodiment, the display 120 may include a protective layer such as tempered glass. In this case, the display 120 may form at least part of the front surface of the electronic device 100. Hereinafter, various example embodiments will be described based on the electronic device 100 of FIG. 1A and FIG. 1B for convenience of description.

Figure 2:
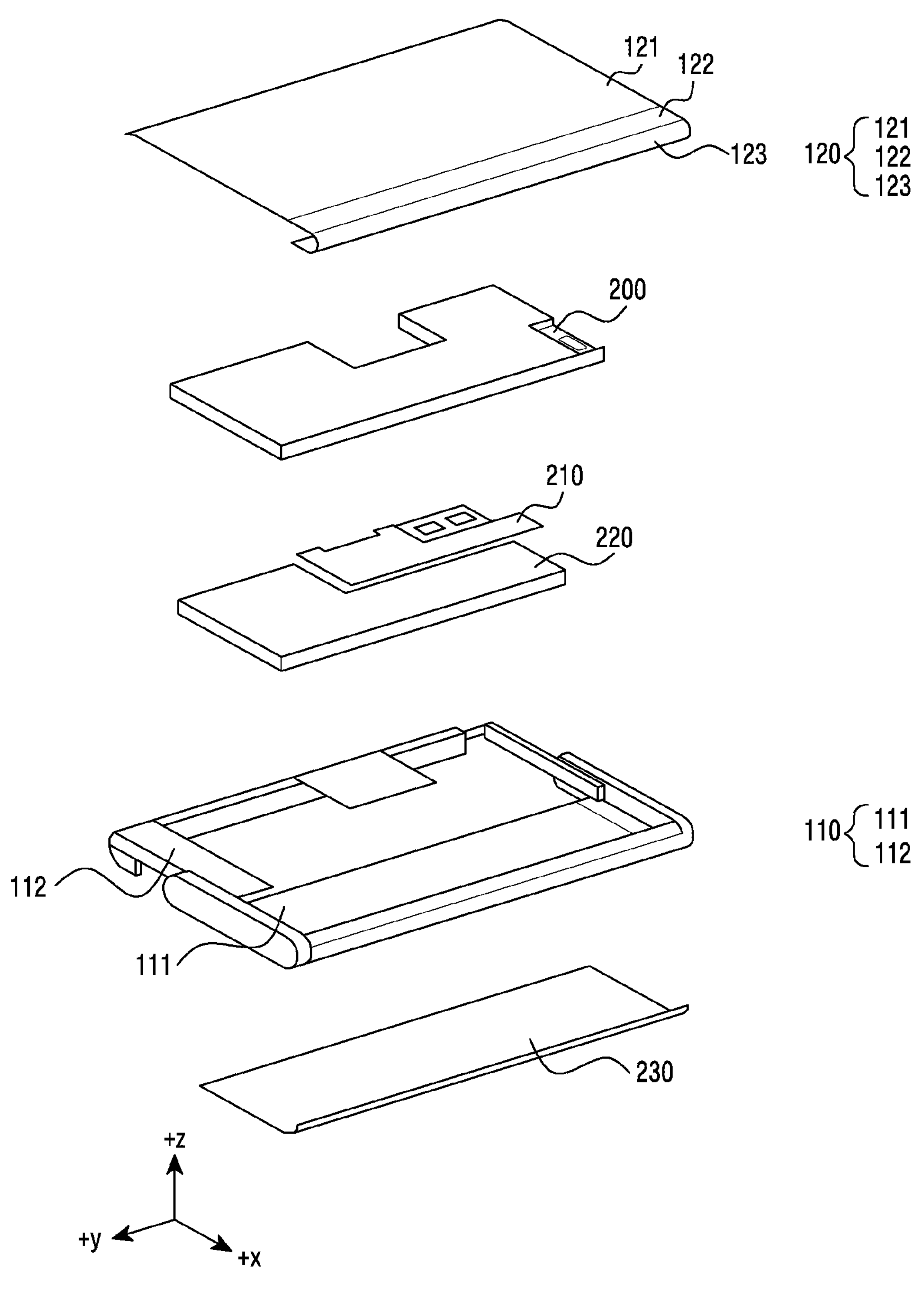
FIG. 2 is an internal exploded view of an electronic device according to various embodiments.

FIG. 2 is an internal exploded view of an electronic device according to various embodiments.

Referring to FIG. 2, according to an embodiment, the electronic device 100 may include the display 120, a bracket 200, a Printed Circuit Board (PCB) 210, a battery 220, the housing 110, and/or a rear cover 230.

According to an embodiment, the display 120 may include the first portion 121 of the display 120, exposed to a user through a front surface when the electronic device 100 is in a first state (e.g., the first state 100*a* of FIG. 1A), the second portion 122 of the display 120, not exposed through the front surface when the electronic device 100 is in the first state 100*a* but exposed to the user through the front surface when the electronic device is converted to a second state (e.g., the second state 100*b* of FIG. 1B), and a third portion 123, not exposed to the user through the front surface when in the first state 100*a* and the second state 100*b*.

In various embodiments, when the display 120 is drawn out (or exposed), it may refer to a drawn-out portion of the display being viewed from the outside of the electronic device 100, and when the display 120 is drawn in, it may refer to a drawn-in portion of the display 120 not being viewed from the outside of the electronic device 100.

According to an embodiment, the bracket 200 may include a conductive plate. For example, the bracket 200 may include a conductive material such as metal (e.g., copper or aluminum).

According to an embodiment, a plurality of electronic components may be disposed to a space defined by the housing 110 and the rear cover 230. For example, the PCB 210 and the battery 220 may be disposed to the space.

According to an embodiment, a plurality of electronic components may be disposed to the PCB 210. In an embodiment, a wireless communication circuit, a processor, a memory, and/or an interface may be disposed to at least one PCB 210. In an embodiment, the PCB 210 may be constructed as one substrate, and the PCB 210 may include a conductive layer.

According to an embodiment, the housing 110 may include the first housing 111 and the second housing 112. In an embodiment, the second housing 112 may be connected slidably in a specific range with respect to the first housing 111. For example, the second housing 112 may be connected to the first housing 111 slidably in a first direction (+x direction) with the transition of the electronic device 100 from the second state 100*b* to the first state 100*a*. As another example, the second housing 112 may be connected to the first housing 111 slidably in a second direction (−x direction) with the transition of the electronic device 100 from the first state 100*a* to the second state 100*b*.

According to an embodiment, the rear cover 230 may form the rear surface of the electronic device 100. The rear cover 230 may protect the electronic device 100 from an external impact or a foreign material.

Figure 3:
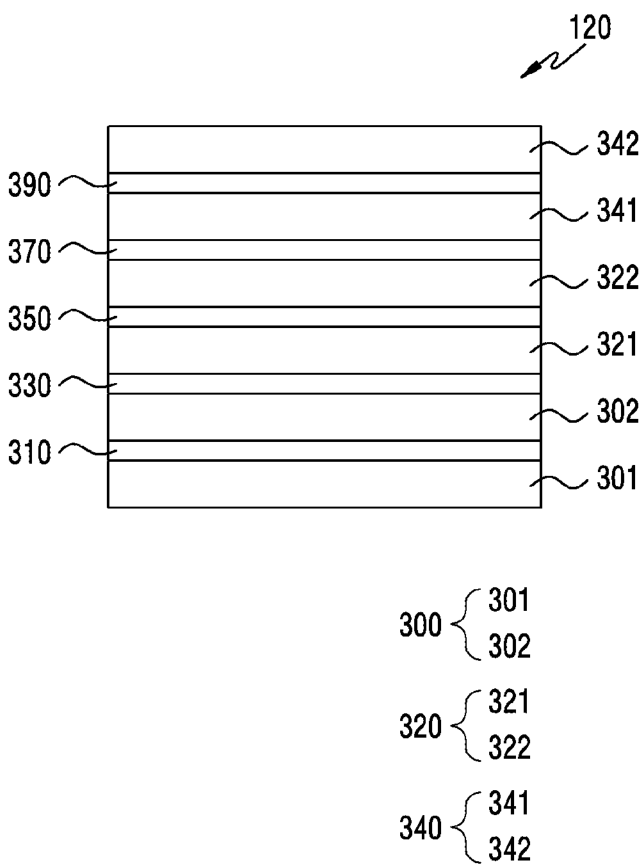
FIG. 3 is a diagram illustrating a stacked structure of a display according to various embodiments.

FIG. 3 is a diagram illustrating a stacked structure of a display according to various embodiments.

Referring to FIG. 3, the display 120 according to an embodiment may include a plurality layers. In an embodiment, the display 120 may include a cover layer 300, a panel layer 320, a window layer 340, and bonding layers 310, 330, 350, 370, and 390. In an embodiment, the cover layer 300 may include a first cover layer 301 and a second cover layer 302. The panel layer 320 may include a display panel 321 and a polarization layer 322. The window layer 340 may include a first window layer 341 and a second window layer 342.

The first cover layer 301, the second cover layer 302, the display panel 321, the polarization layer 322, the first window layer 341, and the second window layer 342 may be stacked in an ordered manner from a lower end of the stacked structure of the display 120 according to an embodiment.

The first cover layer 301 according to an embodiment may comprise metal (e.g., copper, aluminum). In an embodiment, the first cover layer 301 may form a flexible substrate, and bars and/or a support plate to be described in greater detail below with reference to FIG. 4A may be attached to the first cover layer 301. In an embodiment, the bars and/or the support plate may be replaced with a support structure. For example, as the support structure, a multi joint structure may be attached to the first cover layer 301. According to an embodiment, the electronic device 100 may include a hinge rail to move the display 120, and part of the hinge rail may be attached to the first cover layer 301.

According to an embodiment, the first cover layer 301 may include a flexible structure (e.g., a lattice structure) which is bendable or rollable. In an embodiment, the flexible structure may include metal, and may disperse pressure applied to the bars.

According to an embodiment, the second cover layer 302 may comprise various materials. For example, the second cover layer 302 may include a polymer film of polyamide and/or PolyEthylene Terephthalate (PET). As another example, the second cover layer 302 may include a sponge, and the second cover layer 302 may include a heat dissipation layer of graphite or copper (Cu). In an embodiment, the first cover layer 301 and the second cover layer 302 may be bonded by the bonding layer 310.

According to an embodiment, the display panel 321 may include a Thin Film Transistor (TFT) layer and a light emitting layer disposed above the TFT layer, and the TFT layer may be disposed below the light emitting layer. In an embodiment, the TFT layer may be constructed of metal (e.g., copper, aluminum).

According to an embodiment, the light emitting layer may include a plurality of pixels controlled by the TFT. In an embodiment, the light emitting layer may include an Organic Light Emitting Diode (OLED). In an embodiment, when current flows to a source electrode and drain electrode of the TFT, voltage may be applied to an anode and cathode of the light emitting layer electrically coupled to the TFT. Electrons emitted from the anode of the light emitting layer and holes of the cathode are combined in an organic material layer, and exited energy of the combination of the electrons and the holes may be emitted in the form of light. In an embodiment, the light emitting layer may be replaced with a light emitting layer having a structure different from that of the aforementioned OLED.

According to an embodiment, the cover layer 300, the panel layer 320, and the window layer 340, which form the stacked structure of the display 120, may be flexibly curved or bent.

According to an embodiment, the polarization layer 322 may polarize incident light, and may generate linearly polarized light which vibrates light in a specific axial direction and/or circularly polarized light which has an equal amplitude and allows an axis to change. In an embodiment, the polarization layer 322 polarizes light reflected from a TFT layer included in the display panel 321 to secure outdoor visibility. According to an embodiment, the display panel 321 and the polarization layer 322 may be bonded by the bonding layer 350.

According to an embodiment, the first window layer 341 and the second window layer 342 may be formed of various materials. For example, the first window layer 341 and the second window layer 342 may include a polymer film of polyamide and/or PET. As another example, the first window layer 341 and the second window layer 342 may i be formed of resin and/or glass.

According to an embodiment, the first window layer 341 and the second window layer 342 may surround the display panel 321 so that the display panel 321 is not affected by an external environment. For example, since the organic material layer, anode, and/or cathode of the light emitting layer of the display panel 321 react with external moisture or oxygen to deteriorate or lose a light emitting property, the first window layer 341 and the second window layer 342 may be stacked on the display panel 321 to block an influence of the external environment. In an embodiment, the first window layer 341 and the second window layer 342 may include Thin Film Encapsulation (TFE). In an embodiment, the first window layer 341 and the second window layer 342 may be bonded by the bonding layer 390.

According to an embodiment, the bonding layers 310, 330, 350, 370, and 390 may be located between the plurality of layers of the display 120 to bond the layers.

Figure 4A:
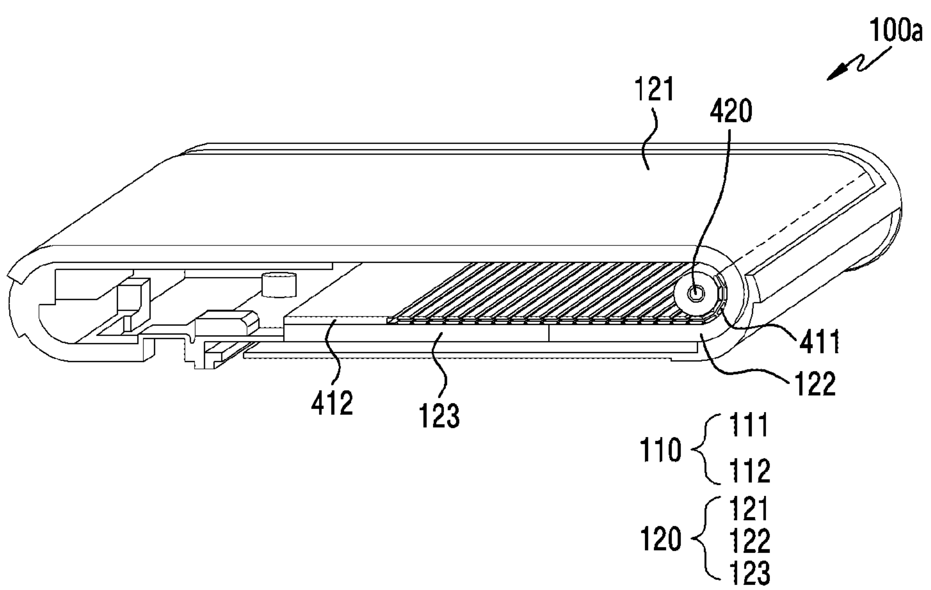
FIG. 4A is a perspective view illustrating a first state of an electronic device, viewed from the outside according to various embodiments.

FIG. 4A is a perspective view illustrating a first state of an electronic device, viewed from the outside according to various embodiments.

Figure 4B:
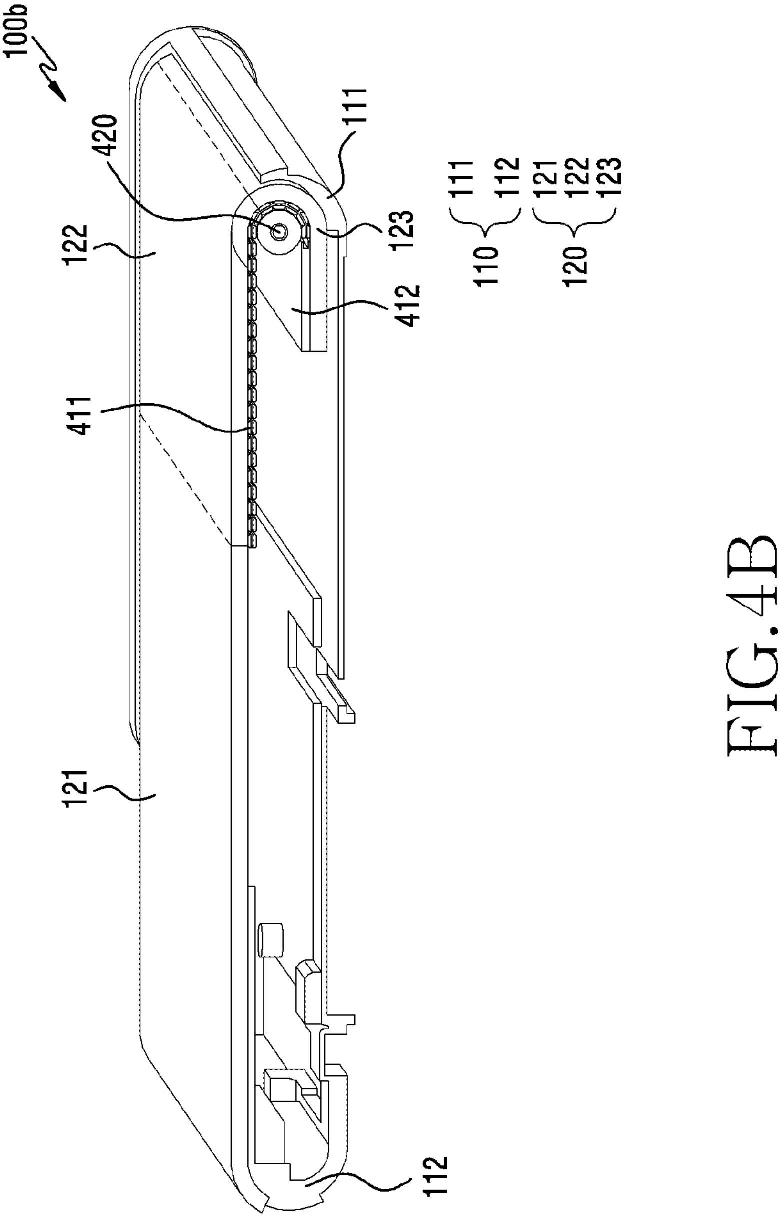
FIG. 4B is a perspective view illustrating a second state of an electronic device, viewed from the outside according to various embodiments.

FIG. 4B is a perspective view illustrating a second state of an electronic device, viewed from the outside according to various embodiments.

Referring to FIG. 4A and FIG. 4B, the electronic device 100 according to an embodiment may include the display 120, the housing 110, bars 411, a support plate 412, and/or a roller unit (e.g., including a roller) 420. In an embodiment, the display 120 may include the first portion 121, the second portion 122, and the third portion 123. The housing 110 may include the first housing 111 and the second housing 112.

According to an embodiment, the bars 411 may be aligned side-by-side to be attached to the rear surface of the second portion 122 and third portion 123 of the display 120. However, the disclosure is not limited thereto, and according to an embodiment, the bars 411 may be attached to the first portion 121 of the display 120. In an embodiment, the bars 411 may further extend along the rear surface of the display 120.

In an embodiment, the bars 411 may be attached to a first cover layer (e.g., the first cover layer 301 of FIG. 3) disposed to a lower end of the stacked structure of the display 120. In an embodiment, the first cover layer 301 having the bars 411 attached thereto may is constructed of a metal material (e.g., copper, aluminum) to form a flexible substrate.

According to an embodiment, the support plate 412 may be attached to a rear surface of the third portion 123 of the display 120. In an embodiment, the support plate 412 may further extend toward an inner direction of the housing 110, and the extended support plate 412 may include a portion not attached to the third portion 123 of the display 120.

According to an embodiment, the support plate 412 may form at least one flat region. In an embodiment, the support plate 412 may be attached to the third portion 123 of the display 120 in the constructed flat region. In an embodiment, a bonding layer may be disposed between the support plate 412 and the third portion 123 of the display 120.

According to an embodiment, the support plate 412 may include a metal (e.g., copper, aluminum).

According to an embodiment, the roller unit 420 may include a roller and be disposed inside the housing 110, and the bars 411 and the support plate 412 may abut against an outer circumferential face of the roller unit 420 to move the display 120.

In an embodiment, the roller unit 420 may include a rotation shaft and a roller connected to the rotation shaft. The rotation shaft and the roller may be integrally constructed. As an embodiment, the rotation shaft and the roller may be constructed in a combined manner.

In an embodiment, the roller included in the roller unit 420 may have a cylindrical shape. In addition thereto, the roller is not limited to the cylindrical shape, and may include another shape in which the display 120 can rotate about the rotation shaft.

Referring to FIG. 4A and FIG. 4B, in an embodiment, a region (portion) of the display 120, exposed to a front portion of the electronic device 100, may vary depending on a movement of the roller unit 420 and bars 411. For example, referring to FIG. 4A, when the electronic device is converted from the second state 100*b* to the first state 100*a*, the bars 411 may be drawn into the inside of the housing 110 due to a rotation of the roller unit 420, and the second portion 122 and third portion 123 of the display 120 to which the bars 411 are attached may be drawn into the inside of the housing 110 due to a movement of the bars 411, so that the second portion 122 and the third portion 123 are not exposed to the front portion. As another example, when the electronic device is converted from the first state 100*a* to the second state 100*b*, some of the bars 411 (e.g., bars attached to the second portion 122) may be drawn out to the outside of the housing 110 due to a rotation of the roller unit 420, and the second portion 122 and third portion 123 of the display 120 to which the bars 411 are attached may be drawn out to the outside of the housing 110 due to a movement of the bars 411, so that the second portion 122 and the third portion 123 are exposed to the front portion.

Figure 5A:
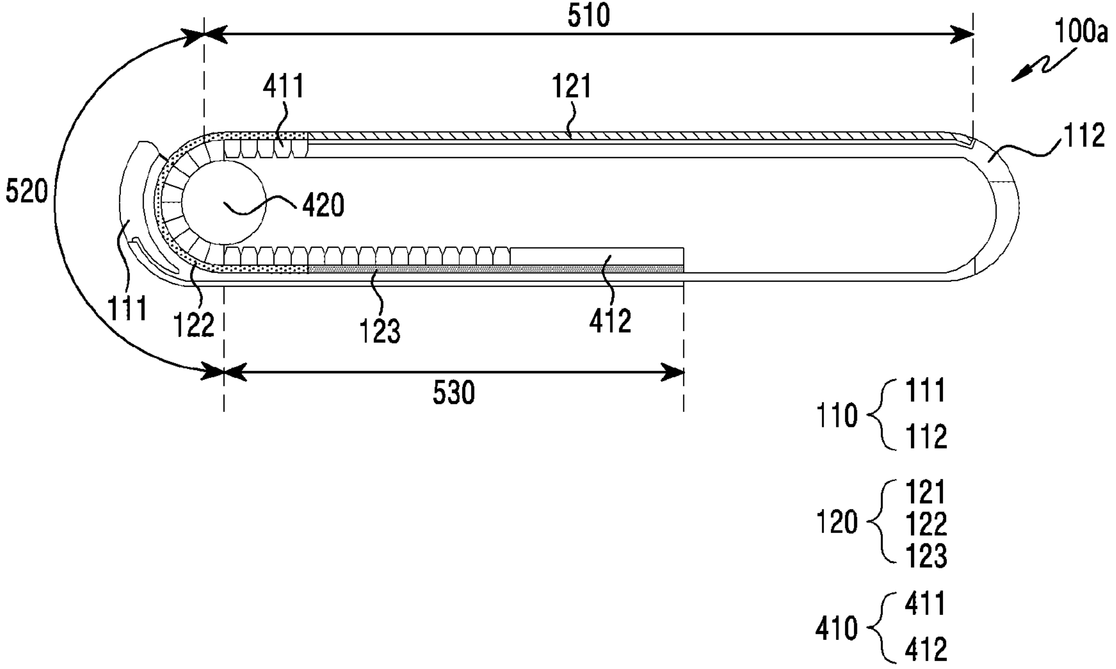
FIG. 5A is a cross-sectional view illustrating an internal view of an electronic device in a first state according to various embodiments.

FIG. 5A is a cross-sectional view illustrating an internal view of an electronic device in a first state according to various embodiments.

Figure 5B:
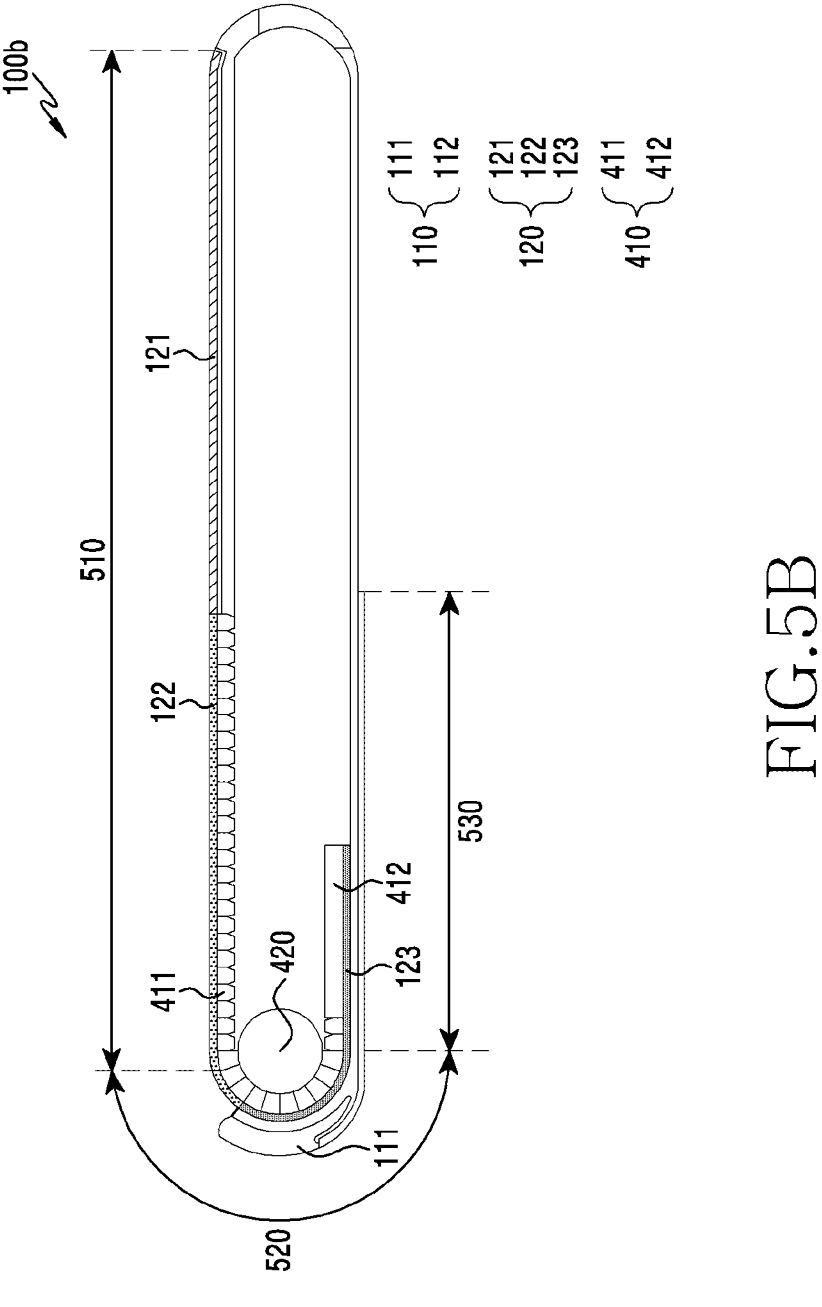
FIG. 5B is a cross-sectional view illustrating an internal view of an electronic device in a second state according to various embodiments.

FIG. 5B is a cross-sectional view illustrating an internal view of an electronic device in a second state according to various embodiments.

Referring to FIG. 5A and FIG. 5B, the display 120 according to an embodiment may move along a first section 510, a second section 520, and a third section 530. In an embodiment, the first section 510 may include a section in which the display 120 exposed to the outside in the first state 100*a* and/or the second state 100*b* forms a flat region. The second section 520 may include a section in which the display 120 is bent and moved due to a rotation of a roller unit in the first state 100*a* and/or the second state 100*b*. The third section 530, as a section in which the display 120 drawn into the inside of the housing 110 in the first state 100*a* and/or the second state 100*b* forms the flat region, may include a section parallel to the first section 510. The same/similar reference numerals are used for the same or substantially the same components as those described above, and redundant descriptions may not be repeated here.

According to an embodiment, the display 120 may move depending on the rotation of the roller unit 420 which abuts against the bars 411. In an embodiment, with the transition of the display 120 from the first state 100*a* to the second state 100*b*, the display 120 may move along the first section 510, the second section 520, and/or the third section 530 due to the rotation of the roller unit 420.

According to an embodiment, with the transition from the first state 100*a* to the second state 100*b*, the first portion 121 of the display 120 may move along the first section 510.

According to an embodiment, with the transition from the first state 100*a* to the second state 100*b*, the second portion 122 of the display 120 may move along the first section 510 and the second section 520.

According to an embodiment, with the transition from the first state 100*a* to the second state 100*b*, the third portion 123 of the display 120 may move along the second section 520 and the third section 530.

According to an embodiment, boundaries of the first portion 121, second portion 122, and third portion 123 of the display 120 are not limited to the boundaries of FIG. 5A and FIG. 5B, and thus the sections 510, 520, and 530 along which the first portion 121, second portion 122, and third portion 123 of the display 120 move may vary.

According to an embodiment, the support plate 412 of the flat region may be attached to the third portion 123 of the display 120.

In an embodiment, although the third portion 123 of the display 120 moves along the second section 520 and the third section 530 while transitioning from the first state 100*a* to the second state 100*b*, at least part of the third portion 123 to which the support plate 412 of the flat region is attached may be located in the third section 530.

Figure 6A:
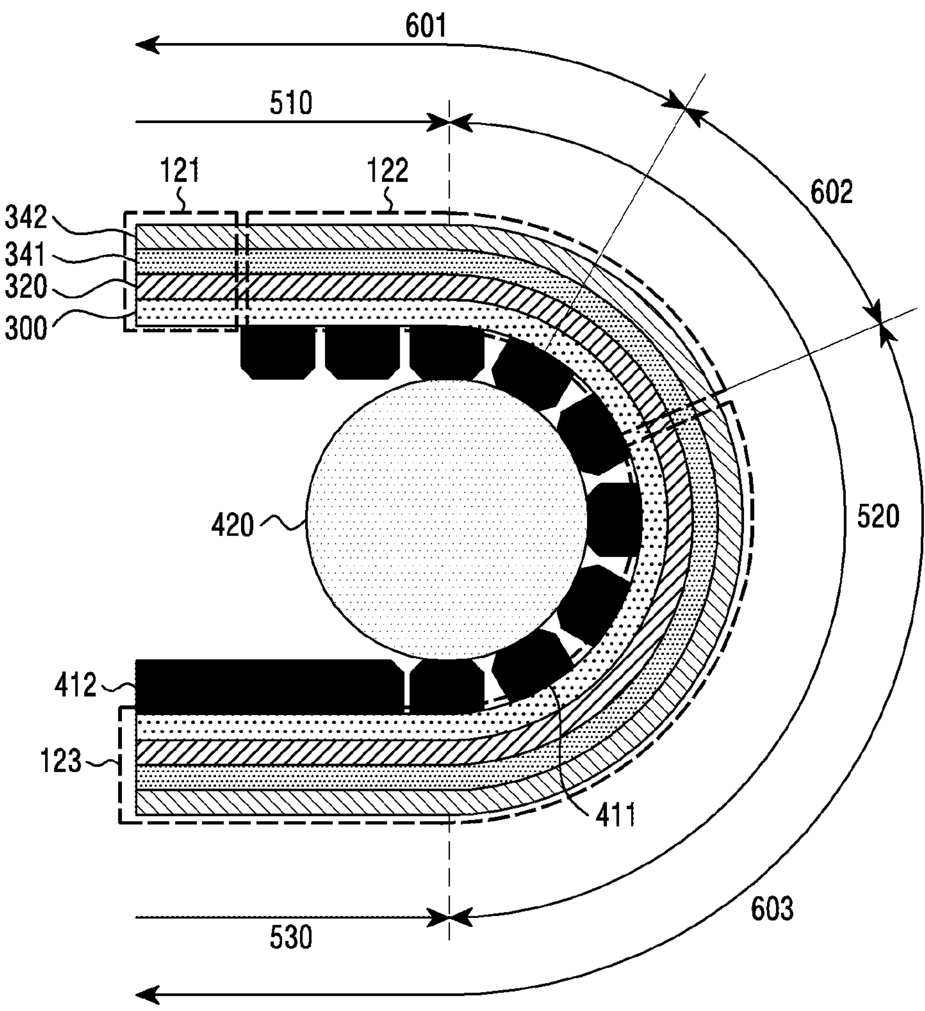
FIG. 6A is a sectional view illustrating a display layout when in a second state according to various embodiments.

FIG. 6A is a sectional view illustrating a display layout when in a second state according to various embodiments.

Figure 6B:
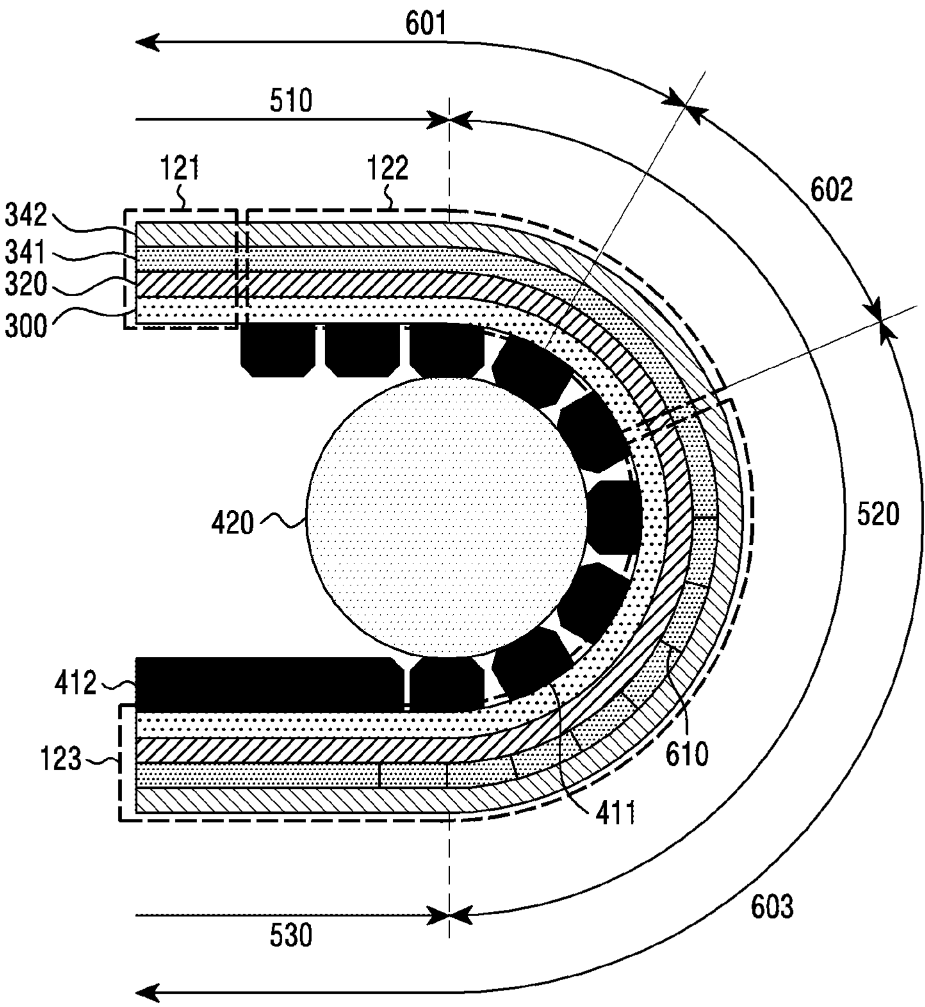
FIG. 6B is a sectional view illustrating a display layout including a slit structure when in a second state according to various embodiments.

FIG. 6B is a sectional view illustrating a display layout including a slit structure when in a second state according to various embodiments.

Figure 7A:
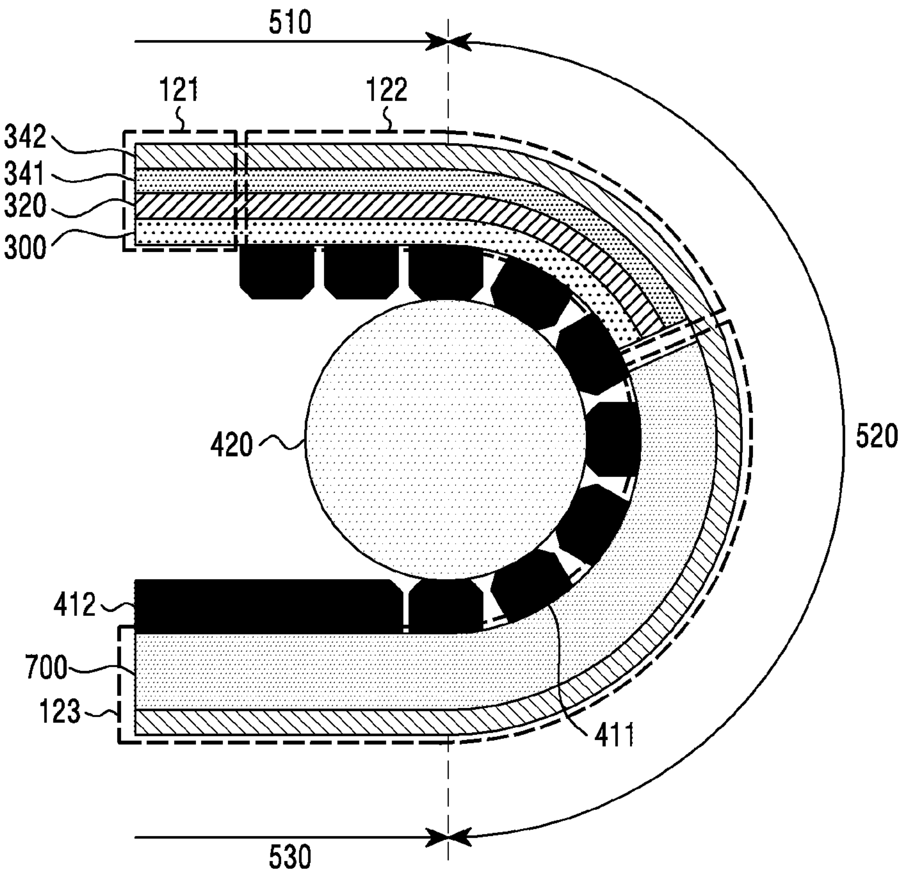
FIG. 7A is a sectional view illustrating a display layout including an adhesive layer when in a second state according to various embodiments.

FIG. 7A is a sectional view illustrating a display layout including an adhesive layer when in a second state according to various embodiments.

Figure 7B:
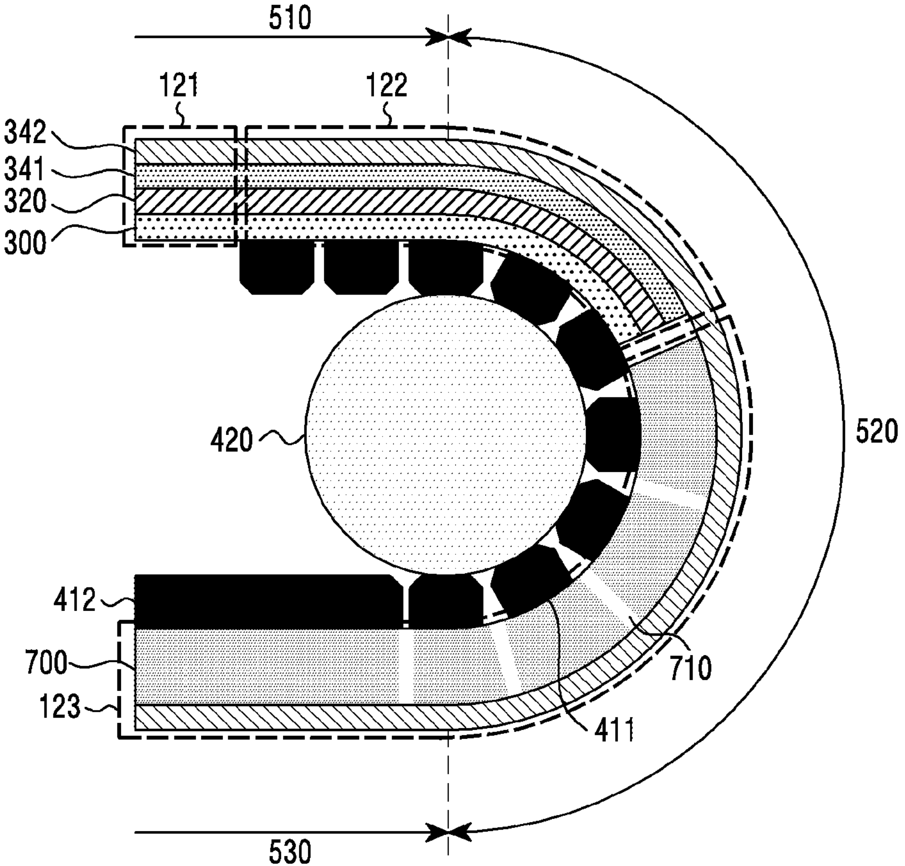
FIG. 7B is a sectional view illustrating a display layout including an adhesive layer and a slit structure when in a second state according to various embodiments.

FIG. 7B is a sectional view illustrating a display layout including an adhesive layer and a slit structure when in a second state according to various embodiments.

Referring to FIG. 6A and FIG. 6B, part of the first portion 121 and second portion 122 according to an embodiment may include a pixel illumination region (e.g., a screen display region) 601. According to an embodiment, the pixel illumination region may refer, for example, to a region including a light emitting element for pixel illumination. In an embodiment, a pixel illuminated from the pixel illumination region 601 may be emitted to the outside of the electronic device 100.

According to an embodiment, part of the second portion 122 may include a wiring region 602. In an embodiment, the wiring region 602 may refer, for example, to a region in which wirings for electrically coupling a circuit inside the display 120 and an electronic component (e.g., a PCB) are integrated.

According to an embodiment, the wiring region 602 may be distinctive to the pixel illumination region 601. According to an embodiment, the wiring region 602 may be included without being distinctive to the pixel illumination region 601. For example, the wiring region 602 may include a light emitting element for pixel illumination. In this case, the wiring region 602 may be included in the pixel illumination region 601.

According to an embodiment, the third portion 123 may include a dummy region 603. In an embodiment, the dummy region 603 may refer, for example, to a region of the display 120, excluding the light emitting element for pixel illumination and/or the wiring structure of the display 120. For example, the third portion 123 of FIG. 6A may include the panel layer 320 extending from the second portion 122. In the panel layer 320 corresponding to the third portion 123, the light emitting element for pixel illumination and/or the wiring structure of the display 120 may be excluded. As another example, the third portion 123 of FIG. 7A does not include the panel layer 320 itself, and thus may not include the light emitting element for pixel illumination and/or the wiring structure of the display 120.

In an embodiment, the dummy region 603 may not include Thin Film Encapsulation (TFE). For example, the dummy region 603 may not include the light emitting element for pixel illumination, the wiring structure of the display 120, and/or the TFE.

According to an embodiment, at least some of a plurality of layers of a stacked structure of the third portion 123 of the display 120 may include or may not include the slit structure 610. For example, referring to FIG. 6A, the third portion 123 of the display 120 disposed to the second section 520 and the third section 530 may not include the slit structure 610. As another example, referring to FIG. 6B, the third portion 123 of the display 120 disposed to the second section 520 and the third section 530 may include the slit structure 610. In an embodiment, the slit structure 610 may include a plurality of slits spaced apart.

According to an embodiment, the slit structure 610 included in the third portion 123 may minimize and/or reduce frictional force when the display 120 moves by means of the roller unit 420.

According to an embodiment, the slit structure 610 may be constructed in the cover layer 300, panel layer 320, first window layer 341, and/or second window layer 342 of the third portion 123 of the display 120. The slit structure 610 may include a plurality of slits spaced apart.

Referring to FIG. 6A. FIG. 6B, FIG. 7A, and FIG. 7B, at least some of the plurality of layers of the third portion 123 of the display 120 may include an adhesive member. According to an embodiment, as some layers of the third portion 123 of the display 120 are formed of the adhesive member, the cover layer 300, the panel layer 320, the first window layer 341, and/or the second 342 may not be included in the third portion 123.

For example, referring to FIG. 7A, the third portion 123 of the display 120 does not include the cover layer 300, the panel layer 320, and the first window layer 341, and instead thereof, may include an adhesive layer 700 formed of an adhesive member. As another example, referring to FIG. 6A, the third portion 123 of the display 120 may not include the adhesive layer 700 formed of a separate adhesive member. In an embodiment, the cover layer 300, panel layer 320, first window layer 341, and/or second window layer 342 of the stacked structure of the display 120 may be replaced with the adhesive layer 700 formed of the adhesive member.

According to an embodiment, the third portion 123 of the display 120 does not include the separate adhesive layer 700, and may not include the cover layer 300, panel layer 320, first window layer 341, and/or second window layer 342 of the stacked structure. For example, the third portion 123 of the display 120 does not include the cover layer 300, and may include the panel layer 320, the first window layer 341, and the second window layer 342. In this case, the bars 411 may be attached to the panel layer 320 disposed to the lowest portion of the stacked structure of the third portion 123.

As another example, the third portion 123 of the display 120 does not include the cover layer 300, the panel layer 320, and the first window layer 341, and may include the second window layer 342. In this case, the bars 411 may be attached to the second window layer 342 of the third portion 123.

Referring to FIG. 7A and FIG. 7B, at least some of the plurality of layers of the third portion 123 of the display 120 may include a slit structure 710. For example, referring to FIG. 7B, the adhesive layer 700 including the adhesive member may have a plurality of slits spaced apart, thereby minimizing and/or reducing frictional force when the display 120 moves.

Figure 8A:
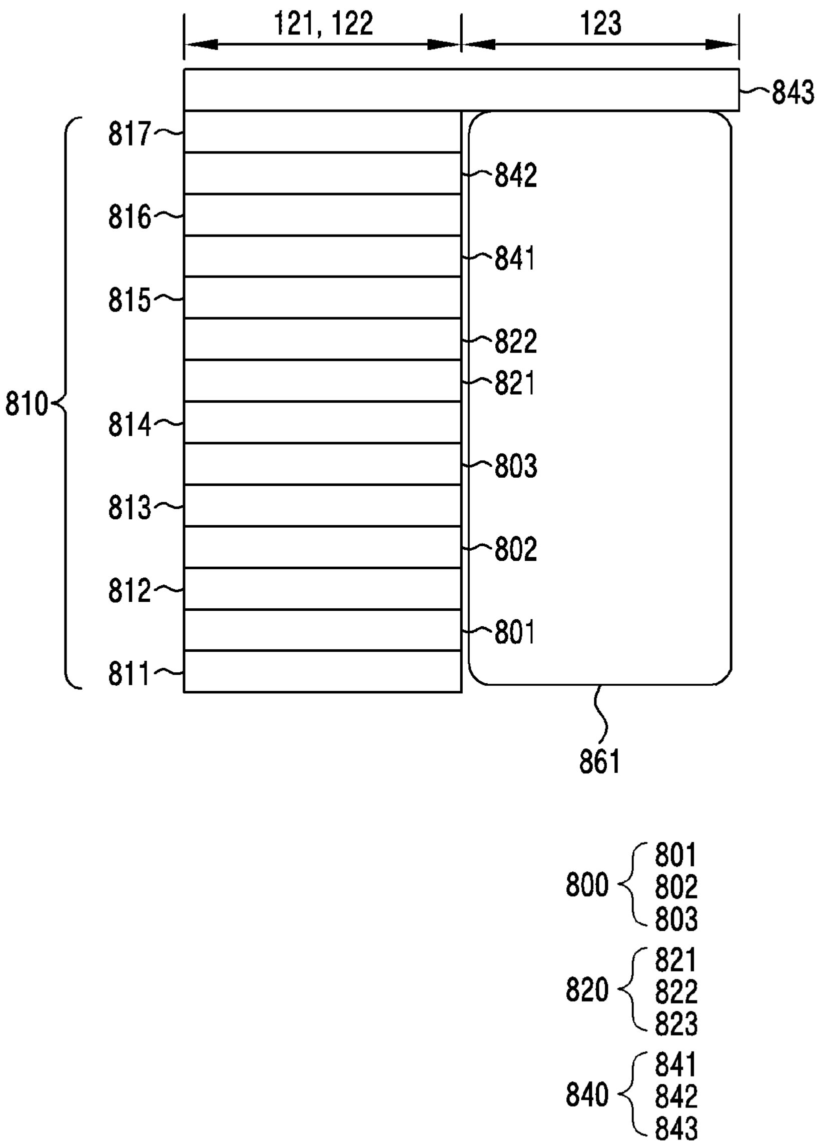
FIG. 8A is a diagram illustrating a stacked structure of a display from which a third window layer extends according to various embodiments.

FIG. 8A is a diagram illustrating a stacked structure of a display from which a third window layer extends according to various embodiments.

Figure 8B:
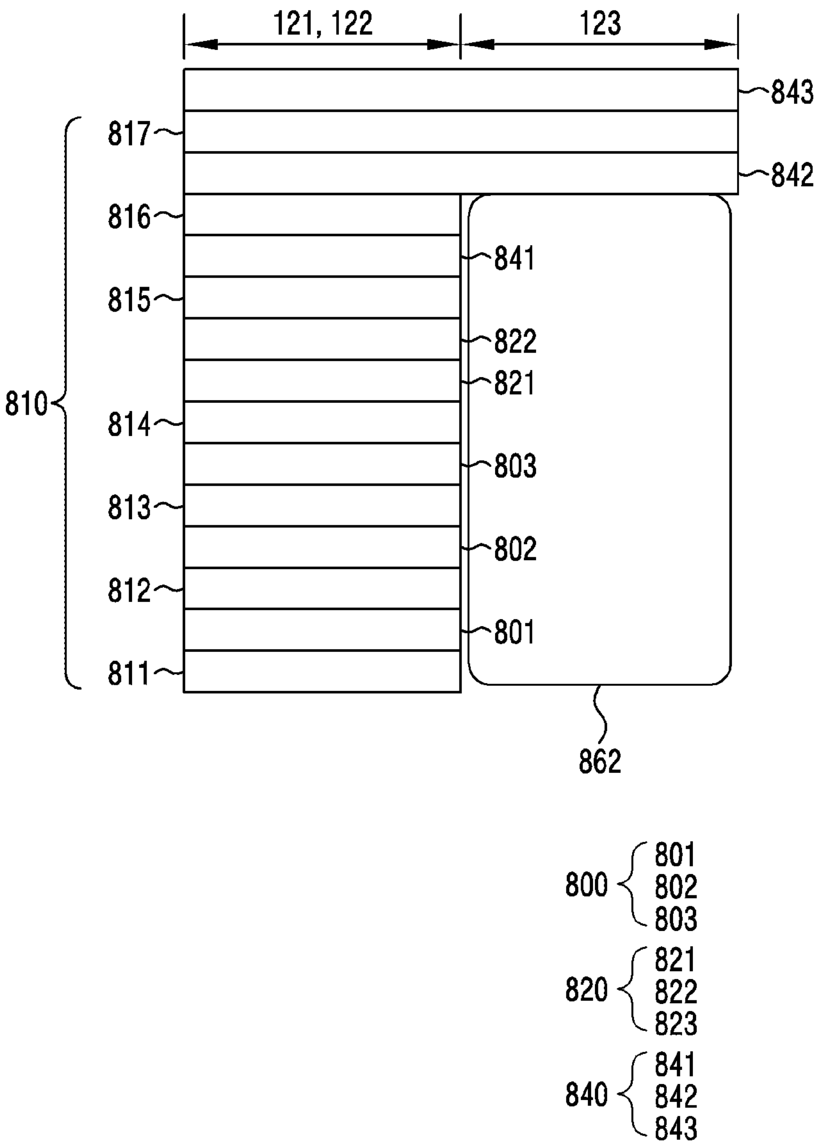
FIG. 8B is a diagram illustrating a stacked structure of a display from which a second window layer and a third window layer extend according to various embodiments.

FIG. 8B is a diagram illustrating a stacked structure of a display from which a second window layer and a third window layer extend according to various embodiments.

Figure 8C:
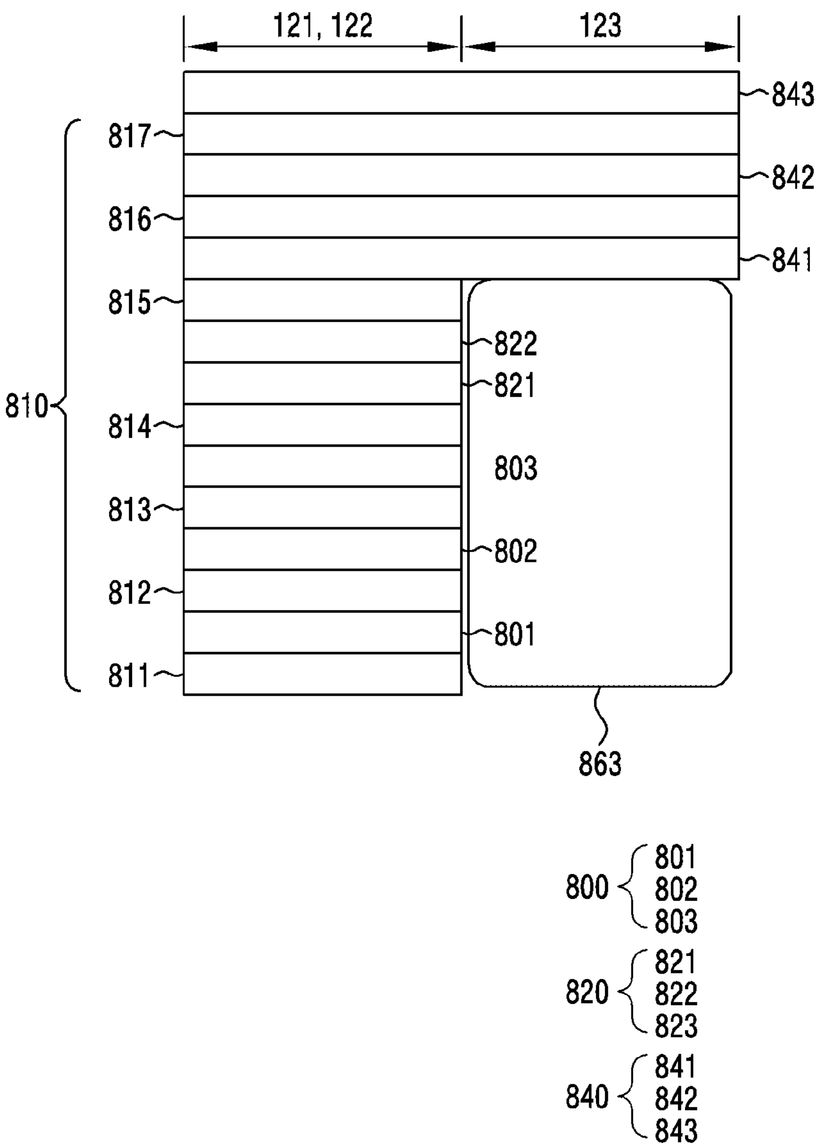
FIG. 8C is a diagram illustrating a stacked structure of a display from which a first window layer, a second window layer, and a third window layer extend according to various embodiments.

FIG. 8C is a diagram illustrating a stacked structure of a display from which a first window layer, a second window layer, and a third window layer extend according to various embodiments.

Figure 8D:
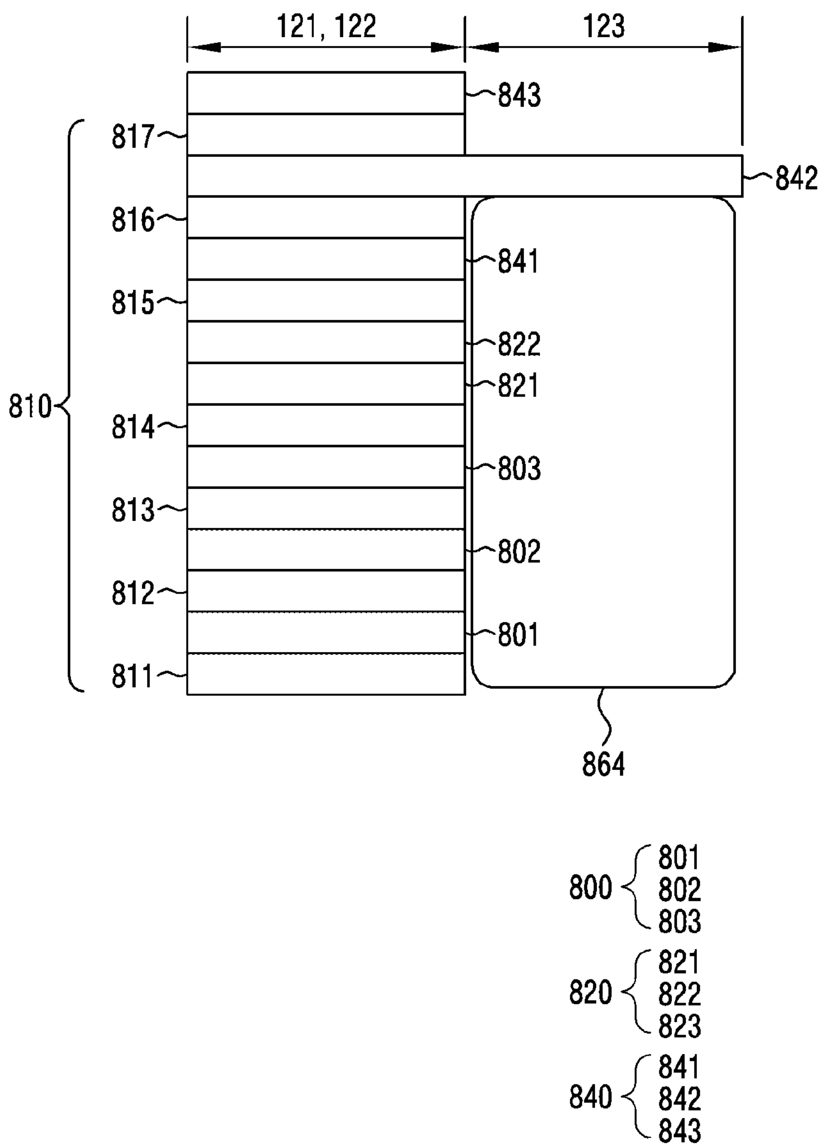
FIG. 8D is a diagram illustrating a stacked structure of a display in which a second window layer extends according to various embodiments.

FIG. 8D is a diagram illustrating a stacked structure of a display in which a second window layer extends according to various embodiments.

Figure 8E:
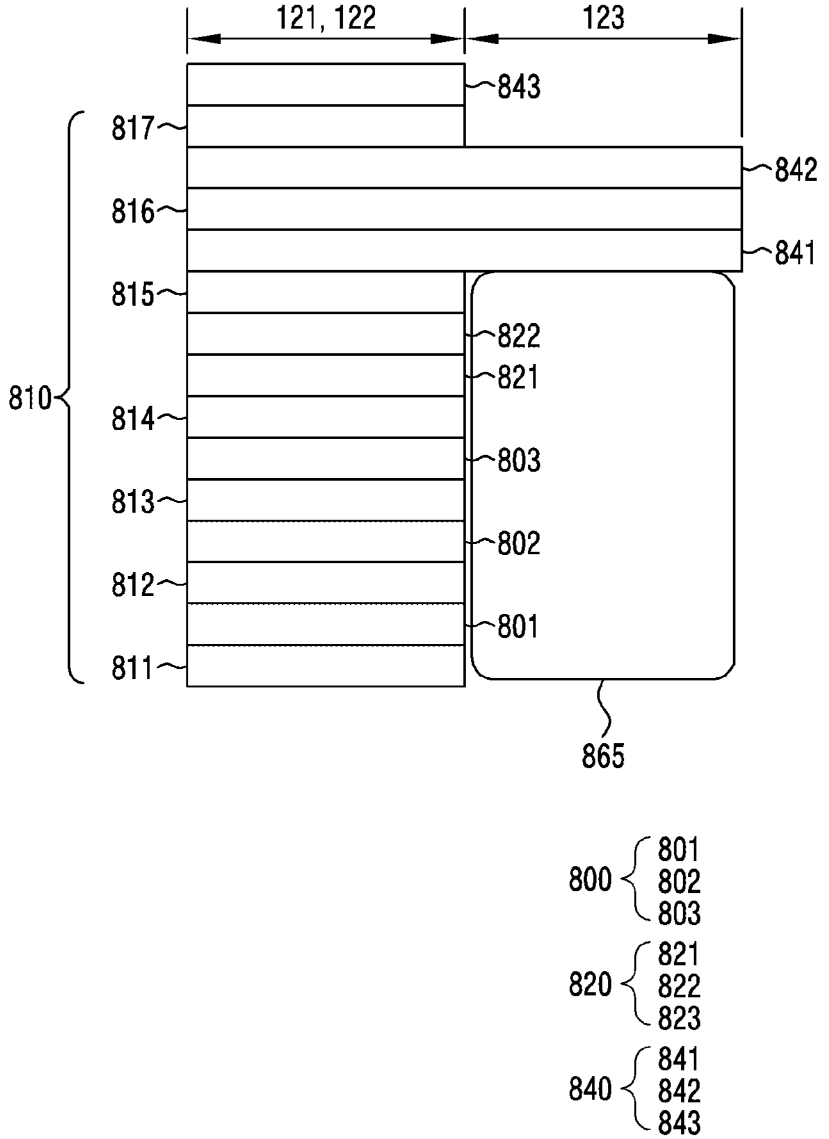
FIG. 8E is a diagram illustrating a stacked structure of a display from which a first window layer and a second window layer extend according to various embodiments.

FIG. 8E is a diagram illustrating a stacked structure of a display from which a first window layer and a second window layer extend according to various embodiments.

Referring to FIG. 8A, FIG. 8B, FIG. 8C, FIG. 8D, and FIG. 8E, the first portion 121 and second portion 122 of the display (e.g., the display 120 of FIG. 7A) may include a first cover layer 801, a second cover layer 802, a third cover layer 803, a display panel 821, a polarization layer 822, a first window layer 841, a second window layer 842, a third window layer 843, and a bonding layer 810. In an embodiment, the bonding layer 810 may include a first bonding layer 811, a second bonding layer 812, a third bonding layer 813, a fourth bonding layer 814, a fifth bonding layer 815, a sixth bonding layer 816, and a seventh bonding layer 817. In an embodiment, the bonding layer 810 which is a layer disposed between the plurality of layers of the display 120 to bond the layers may be included in a stacked structure of the third portion 123 of the display 120 and may be distinctive to adhesive layers 861, 862, 863, 864, and 865 of a single layer or a composite layer.

According to an embodiment, the adhesive layers 861, 862, 863, 864, and 865 may be formed of a material (e.g., resin) having an adhesive property. In an embodiment, the adhesive layers 861, 862, 863, 864, and 865 may be a single layer or a composite layer. For example, the adhesive layer 861 may be formed of an adhesive single layer formed of an adhesive member. As another example, the adhesive layer 861 may be made by mixing the adhesive layer formed of the adhesive member and a flexible film formed of a different material (e.g., polyamide).

According to an embodiment, the first cover layer 801 may be formed of metal (e.g., aluminum, copper). In an embodiment, the first cover layer 801 may serve as a support member for supporting the display 120.

According to an embodiment, the second cover layer 802 and/or the third cover layer 803 may protect the display panel 821 from an external impact, and may dissipate heat emitted from the display panel 821.

According to an embodiment, the first window layer 841, the second window layer 842, and/or the third window layer 843 may include a polymer film including polyamide, Ultra-Thin Glass (UTG), and/or polyethylene terephthalate.

Referring to FIG. 8A, the third portion 123 of the display 120 according to an embodiment may include the third window layer 843, which extends from the first portion 121 and second portion 122 of the display 120, and the adhesive layer 861.

Referring to FIG. 8B, the third portion 123 of the display 120 according to an embodiment may include the second window layer 842 and third window layer 843, which extend from the first portion 121 and second portion 122 of the display 120, and the adhesive layer 862.

Referring to FIG. 8C, the third portion 123 of the display 120 according to an embodiment may include the first window 841, second window layer 842, and third window layer 843, which extend from the first portion 121 and second portion 122 of the display 120, and the adhesive layer 863.

Referring to FIG. 8D, the third portion 123 of the display 120 according to an embodiment may include the second window layer 842, which extends from the first portion 121 and second portion 122 of the display 120, and the adhesive layer 864.

Referring to FIG. 8E, the third portion 123 of the display 120 according to an embodiment may include the first window layer 841 and second window layer 842, which extend from the first portion 121 and second portion 122 of the display 120, and the adhesive layer 865.

Referring to FIG. 8A, FIG. 8B, FIG. 8C, FIG. 8D, and FIG. 8E, the stacked structure of the first portion 121, second portion 122, and third portion 123 of the display 120 according to an embodiment is not limited to the aforementioned embodiments, and a layer of at least one of the first cover layer 801, second cover layer 802, third cover layer 803, display panel 821, polarization layer 822, first window layer 841, second window layer 842, and third window layer 843 included in the stacked structure of the first portion 121 and second portion 122 of the display 120 may extend to be included in the third portion 123.

The bars 411 and/or support plate 412 according to an embodiment may be attached to the second portion 122 and third portion 123 of the display 120.

The third portion 123 of the display 120 according to an embodiment may be fixed in a flat region constructed by a support plate (e.g., the support plate 412 of FIG. 7A).

Figure 9A:
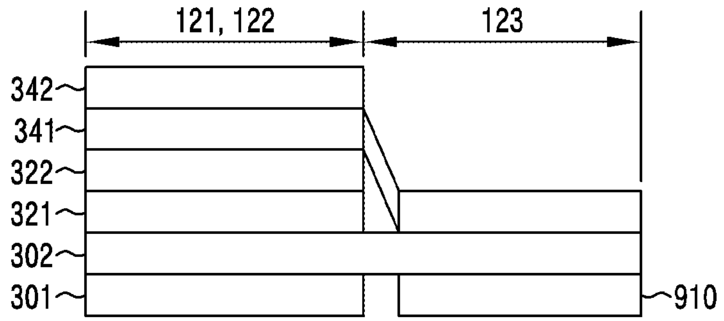
FIG. 9A is a diagram illustrating an example of a stacked structure of a display from which a second cover layer and a first window layer extend according to various embodiments.

FIG. 9A is a diagram illustrating an example of a stacked structure of a display from which a second cover layer and a first window layer extend according to various embodiments.

Figure 9B:
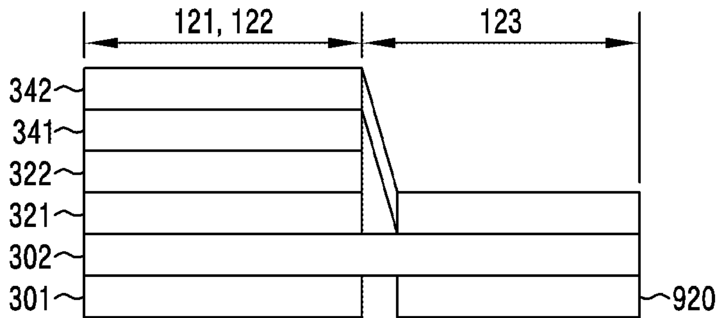
FIG. 9B is a diagram illustrating an example of a stacked structure of a display from which a second cover layer and a second window layer extend according to various embodiments.

FIG. 9B is a diagram illustrating an example of a stacked structure of a display from which a second cover layer and a second window layer extend according to various embodiments.

Figure 9C:
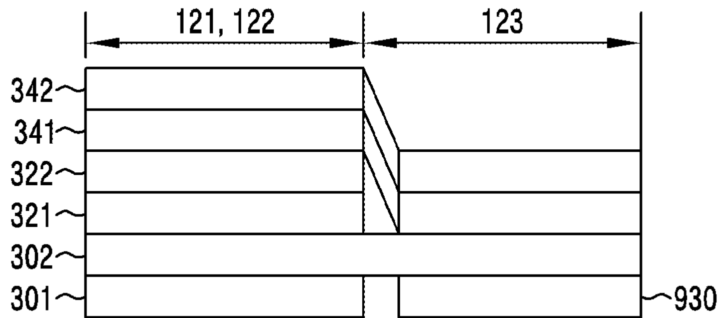
FIG. 9C is a diagram illustrating an example of a stacked structure of a display from which a second cover layer, a first window layer, and a second window layer extend according to various embodiments.

FIG. 9C is a diagram illustrating an example of a stacked structure of a display from which a second cover layer, a first window layer, and a second window layer extend according to various embodiments.

Figure 9D:
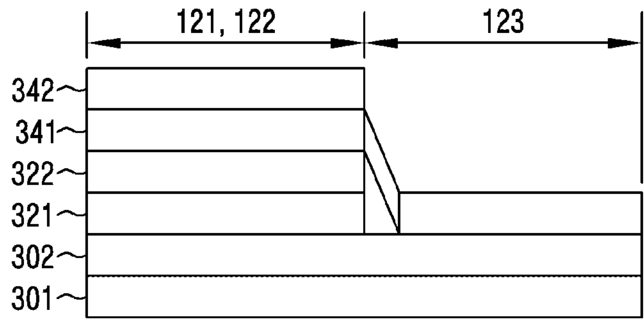
FIG. 9D is a diagram illustrating an example of a stacked structure of a display from which a first cover layer and a first window layer extend according to various embodiments.

FIG. 9D is a diagram illustrating an example of a stacked structure of a display from which a first cover layer and a first window layer extend according to various embodiments.

Figure 9E:
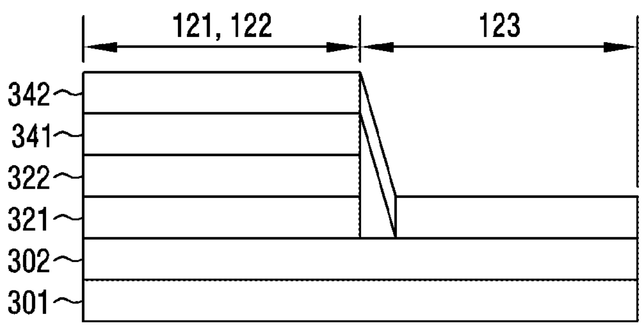
FIG. 9E is a diagram illustrating an example of a stacked structure of a display from which a first cover layer, a second cover layer, and a second window layer extend according to various embodiments.

FIG. 9E is a diagram illustrating an example of a stacked structure of a display from which a first cover layer, a second cover layer, and a second window layer extend according to various embodiments.

Figure 9F:
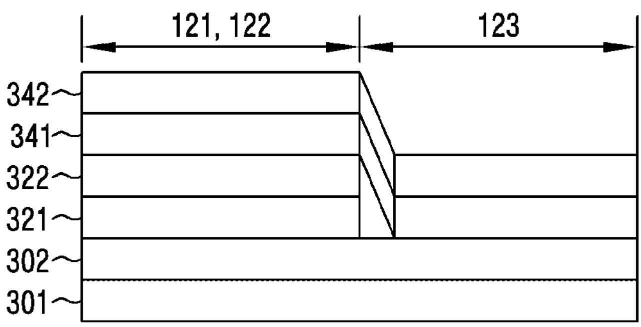
FIG. 9F is a diagram illustrating an example of a stacked structure of a display from which a first cover layer, a second cover layer, a first window layer, and a second window layer extend according to various embodiments.

FIG. 9F is a diagram illustrating an example of a stacked structure of a display from which a first cover layer, a second cover layer, a first window layer, and a second window layer extend according to various embodiments.

Figure 9G:
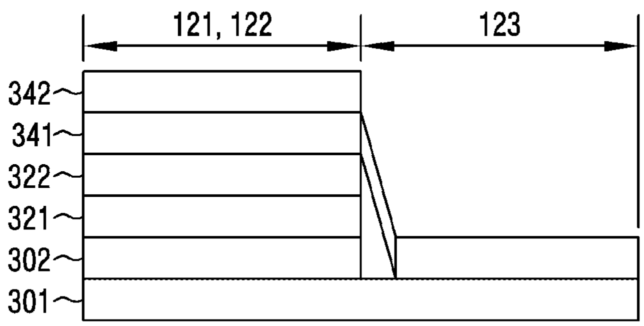
FIG. 9G is a diagram illustrating an example of a stacked structure of a display from which a first cover layer and a first window layer extend according to various embodiments.

FIG. 9G is a diagram illustrating an example of a stacked structure of a display from which a first cover layer and a first window layer extend according to various embodiments.

Figure 9H:
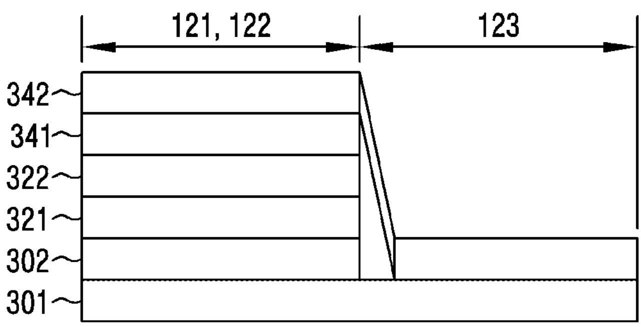
FIG. 9H is a diagram illustrating an example of a stacked structure of a display from which a first cover layer and a second window layer extend according to various embodiments.

FIG. 9H is a diagram illustrating an example of a stacked structure of a display from which a first cover layer and a second window layer extend according to various embodiments.

Figure 9I:
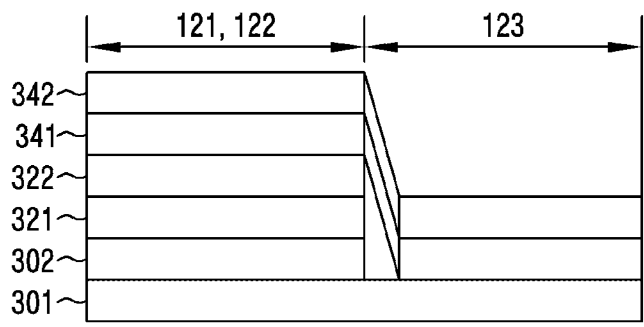
FIG. 9I is a diagram illustrating an example of a stacked structure of a display from which a first cover layer, a first window layer, and a second window layer extended according to various embodiments.

FIG. 9I is a diagram illustrating an example of a stacked structure of a display from which a first cover layer, a first window layer, and a second window layer extended according to various embodiments.

Referring to FIG. 9A, FIG. 9B, FIG. 9C, FIG. 9D, FIG. 9E, FIG. 9F, FIG. 9G, FIG. 9H, and FIG. 9I, the third portion 123 of the display (e.g., the display 120 of FIG. 7A) according to an embodiment may include adhesive layers 910, 920, and 930. The same/similar reference numerals are used for the same or substantially the same components as those described above, and redundant descriptions will be omitted.

Referring to FIG. 9A, the third portion 123 of the display 120 according to an embodiment may include the second cover layer 302 and first window layer 341, which extend from the first portion 121 and second portion 122 of the display 120, and the adhesive layer 910.

Referring to FIG. 9B, the third portion 123 of the display 120 according to an embodiment may include the second cover layer 302 and second window layer 342, which extend from the first portion 121 and second portion 122 of the display 120, and the adhesive layer 920.

Referring to FIG. 9C, the third portion 123 of the display 120 according to an embodiment may include the second cover layer 302, first window layer 341, and second window layer 342, which extend from the first portion 121 and second portion 122 of the display 120, and the adhesive layer 930.

Referring to FIG. 9D, the third portion 123 of the display 120 according to an embodiment may include the first cover layer 301, second cover layer 302, and first window layer 341, which extend from the first portion 121 and second portion 122 of the display 120.

Referring to FIG. 9E, the third portion 123 of the display 120 according to an embodiment may include the first cover layer 301, second cover layer 302, and second window layer 342, which extend from the first portion 121 and second portion 122 of the display 120.

Referring to FIG. 9F, the third portion 123 of the display 120 according to an embodiment may include the first cover layer 301, second cover layer 302, first window layer 341, and second window layer 342, which extend from the first portion 121 and second portion 122 of the display 120.

Referring to FIG. 9G, the third portion 123 of the display 120 according to an embodiment may include the first cover layer 301 and first window layer 341, which extend from the first portion 121 and second portion 122 of the display 120.

Referring to FIG. 9H, the third portion 123 of the display 120 according to an embodiment may include the first cover layer 301 and second window layer 342, which extend from the first portion 121 and second portion 122 of the display 120.

Referring to FIG. 9I, the third portion 123 of the display 120 according to an embodiment may include the first cover layer 301, first window layer 341, and second window layer 342, which extend from the first portion 121 and second portion 122 of the display 120.

The third portion 123 of the display 120 according to an embodiment may have a different stacked structure depending on the first cover layer 301. For example, referring to FIG. 9A, FIG. 9B, and FIG. 9C, the first cover layer 301 does not extend to the third portion 123 of the display 120, and the third portion 123 may form a stacked structure in which the adhesive layer 910 is disposed in response to the first cover layer 301 which does not extend. As another example, referring to FIG. 9D, FIG. 9E, FIG. 9F, FIG. 9G, FIG. 9H, and FIG. 9I, the third portion 123 of the display 120 may have a stacked structure in which the first cover layer 301 extends to the third portion 123. In an embodiment, the first cover layer, which is formed of metal (e.g., copper, aluminum), may stably support the display 120.

The third portion 123 of the display 120 according to an embodiment may have a different stacked structure depending on the second cover layer 302. For example, referring to FIG. 9A, FIG. 9B, FIG. 9C, FIG. D, FIG. 9E, and FIG. 9F, since the second cover 302 extents to the third portion, the third portion 123 of the display 120 may form a stacked structure of the display, including the second cover layer 302. As another example, referring to FIG. 9G, FIG. 9H, and FIG. 9I, since the second cover layer 302 does not extend to the third portion, the third portion 123 of the display 120 may form a stacked structure excluding the second cover layer 302.

Referring to FIG. 9A, FIG. 9B, FIG. 9C, FIG. 9D, FIG. E, FIG. 9F, FIG. 9G, FIG. 9H, and FIG. 9I, the stacked structure of the first portion 121, second portion 122, and third portion 123 of the display 120 according to an embodiment is not limited to the embodiments above. The stacked structure of the display 120 may be arranged in such a manner that at least any one layer among the first cover layer 301, second cover layer 302, display panel 321, polarization layer 322, first window layer 341, and second window layer 342 included in the first portion 121 and second portion 122 of the display 120 extends to be included in the third portion 123.

Figure 10A:
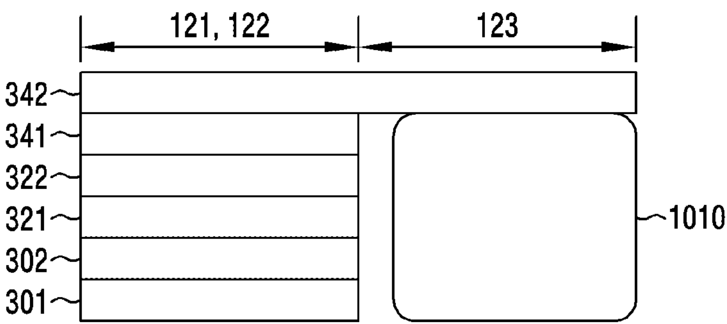
FIG. 10A is a diagram illustrating an example of a stacked structure of a display which has an adhesive layer of a medium thickness and from which a second window layer extends according to various embodiments.

FIG. 10A is a diagram illustrating an example of a stacked structure of a display which has an adhesive layer of a medium thickness and from which a second window layer extends according to various embodiments.

Figure 10B:
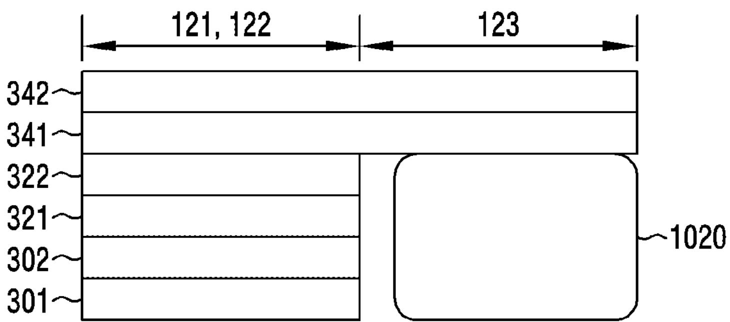
FIG. 10B is a diagram illustrating an example of a stacked structure of a display which has an adhesive layer of a medium thickness and from which a first window layer and a second window layer extend according to various embodiments.

FIG. 10B is a diagram illustrating an example of a stacked structure of a display which has an adhesive layer of a medium thickness and from which a first window layer and a second window layer extend according to various embodiments.

Figure 10C:
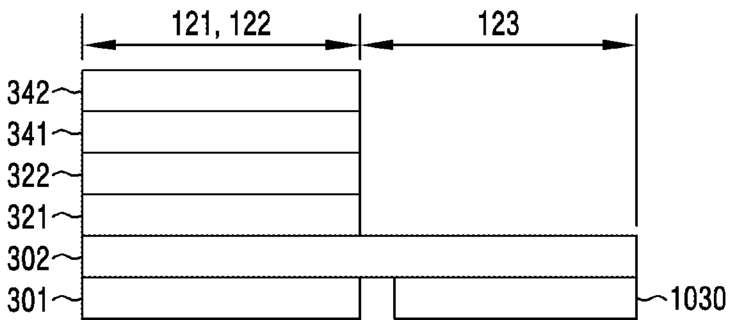
FIG. 10C is a diagram illustrating an example of a stacked structure of a display which does not have an adhesive layer of a medium thickness and from which a second cover layer extends according to various embodiments.

FIG. 10C is a diagram illustrating an example of a stacked structure of a display which does not have an adhesive layer of a medium thickness and from which a second cover layer extends according to various embodiments.

Figure 10D:
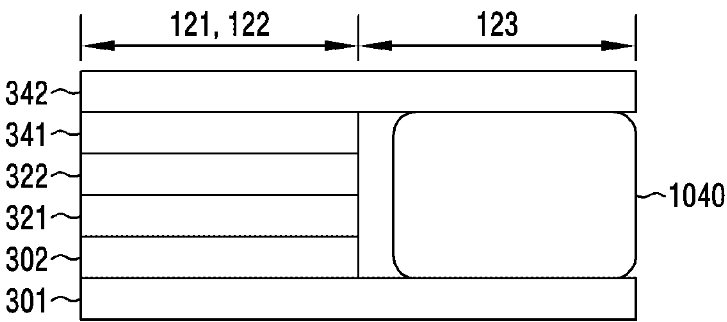
FIG. 10D is a diagram illustrating an example of a stacked structure of a display which has an adhesive layer of medium thickness and from which a first cover layer and a second window layer extend according to various embodiments.

FIG. 10D is a diagram illustrating an example of a stacked structure of a display which has an adhesive layer of medium thickness and from which a first cover layer and a second window layer extend according to various embodiments.

Figure 10E:
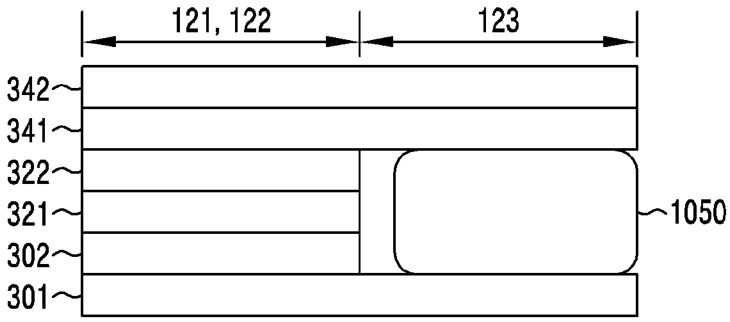
FIG. 10E is a diagram illustrating an example of a stacked structure of a display which has an adhesive layer of a medium thickness and from which a first cover layer, a first window layer, and a second window layer extend according to various embodiments.

FIG. 10E is a diagram illustrating an example of a stacked structure of a display which has an adhesive layer of a medium thickness and from which a first cover layer, a first window layer, and a second window layer extend according to various embodiments.

Figure 10F:
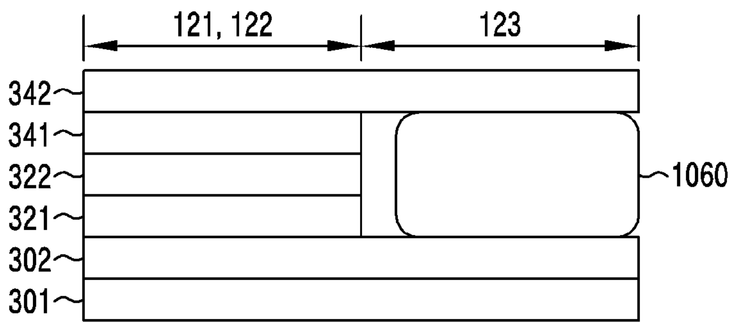
FIG. 10F is a diagram illustrating an example of a stacked structure of a display which has an adhesive layer of a medium thickness and from which a first cover layer, a second cover layer, and a second window layer extend according to various embodiments.

FIG. 10F is a diagram illustrating an example of a stacked structure of a display which has an adhesive layer of a medium thickness and from which a first cover layer, a second cover layer, and a second window layer extend according to various embodiments.

Figure 10G:
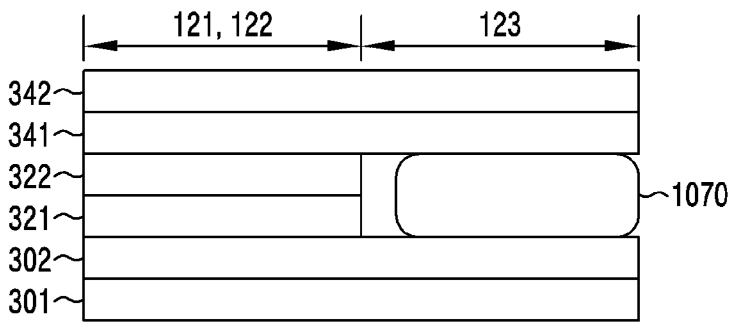
FIG. 10G is a diagram illustrating an example of a stacked structure of a display which does not have an adhesive layer of a medium thickness and from which a first cover layer, a second cover layer, a first window layer, and a second window layer extend according to various embodiments.

FIG. 10G is a diagram illustrating an example of a stacked structure of a display which does not have an adhesive layer of a medium thickness and from which a first cover layer, a second cover layer, a first window layer, and a second window layer extend according to various embodiments.

Referring to FIG. 10A, FIG. 10B, FIG. 10C, FIG. 10D, FIG. 10E, FIG. 10F, and FIG. 10G, the third portion 123 of the display 120 according to an embodiment may include adhesive layers 1010, 1020, 1030, 1040, 1050, 1060, and 1070. The same/similar reference numerals are used for the same or substantially the same components as those described above, and redundant descriptions may not be repeated here.

Referring to FIG. 10A, the third portion 123 of the display 120 according to an embodiment may include the second window layer 342, which extends from the first portion 121 and second portion 122 of the display 120, and the adhesive layer 1010.

Referring to FIG. 10B, the third portion 123 of the display 120 according to an embodiment may include the first window layer 341 and second window layer 342, which extend from the first portion 121 and second portion 122 of the display 120, and the adhesive layer 1020.

Referring to FIG. 10C, the third portion 123 of the display 120 according to an embodiment may include the second cover layer 302, which extends from the first portion 121 and second portion 122 of the display 120, and the adhesive layer 1030. According to an embodiment, the third portion 123 including the dummy region 603 may not include the first window layer 341 and second window layer 342 which include a Thin Film Encapsulation (TFE) layer. Since the third portion 123 does not include the first window layer 341 and the second window layer 342, the third portion 123 may not include the TFE layer. As a result, the dummy region 603 may not include the TFE layer.

Referring to FIG. 10D, the third portion 123 of the display 120 according to an embodiment may include the first cover layer 301 and second window layer 342, which extend from the first portion 121 and second portion 122 of the display 120, and the adhesive layer 1040.

Referring to FIG. 10E, the third portion 123 of the display 120 according to an embodiment may include the first cover layer 301, first window layer 341, and second window layer 342, which extend from the first portion 121 and second portion 122 of the display 120, and the adhesive layer 1050.

Referring to FIG. 10F, the third portion 123 of the display 120 according to an embodiment may include the first cover layer 301, second cover layer 302, and second window layer 342, which extend from the first portion 121 and second portion 122 of the display 120, and the adhesive layer 1060.

Referring to FIG. 10G, the third portion 123 of the display 120 according to an embodiment may include the first cover layer 301, second cover layer 302, first window layer 341, and second window layer 342, which extend from the first portion 121 and second portion 122 of the display 120, and the adhesive layer 1070.

The third portion 123 of the display 120 may form an empty space at a portion of the stacked structure. For example, referring to FIG. 10A, the adhesive layer 1010 may be formed below the second window layer 342 extending up to the third portion 123 of the display 120, and the adhesive layer 1010 may be disposed spaced apart from a plurality of layers of the second portion 122 of the display 120, thereby providing the empty space at one portion of the stacked structure of the third portion 123. As an embodiment, the empty space may be filled with a filler (e.g., polypropylene).

The third portion 123 of the display 120 according to an embodiment may have a different stacked structure depending on the adhesive layers 1010, 1020, 1040, 1050, 1060, and 1070 having a medium thickness. For example, referring to FIG. 10A, FIG. 10B, FIG. 10D, FIG. 10E, FIG. 10F, FIG. 10G, the third portion 123 of the display 120 may include the adhesive layers 1010, 1020, 1040, 1050, 1060, and 1070 having a medium thickness, corresponding to a plurality of layers of the first portion 121 and second portion 122 of the display 120. As another example, referring to FIG. 10B, the third portion 123 of the display 120 may include the adhesive layer 1030 corresponding to the first cover layer 301 of the first portion 121 and second portion 122 of the display 120.

The third portion 123 of the display 120 according to an embodiment may have a different stacked structure depending on the first cover layer 301. For example, referring to FIG. 10A, FIG. 10B, and FIG. 10C, since the first cover layer 301 does not extend to the third portion 123, the third portion 123 may have a stacked structure in which the adhesive layer 910 is disposed in replacement of the first cover layer 301. As another example, referring to FIG. 10D, FIG. 10E, FIG. 10F, and FIG. 10G, the third portion 123 of the display 120 may have a stacked structure in which the first cover layer 301 extends to the third portion 123. In an embodiment, the first cover layer 301 may be formed of a metal (e.g., copper, aluminum).

The third portion 123 of the display 120 according to an embodiment may have a different stacked structure depending on the first window layer 341 and the second cover layer 302. For example, referring to FIG. 10D, since the first window layer 341 and the second cover layer 302 do not extend, the third portion 123 may form a stacked structure including the adhesive layer 1040. As another example, referring to FIG. 10E, since the first window layer 341 extends and the second cover layer 302 does not extend, the third portion 123 may form a stacked structure including the adhesive layer 1050. As another example, referring to FIG. 10F, since the first window layer 341 does not extend and only the second cover layer 302 extends, the third portion 123 may form a stacked structure including the adhesive layer 1060. As another example, referring to FIG. 9G, since the first window layer 341 and the second cover layer 302 extend, the third portion 123 may form a stacked structure including the adhesive layer 1070.

The aforementioned examples of FIG. 9A to FIG. 10G are only examples for describing that at least one layer among the plurality of layers of the second portion 122 of the display 120 extends to form the third portion 123, and the disclosure is not limited only to the embodiment described with reference to FIG. 9A to FIG. 10G. Accordingly, at least one layer among the plurality of layers (the first cover layer 301, the second cover layer 302, the display panel 321, the polarization layer 322, the first window layer 341, and the second window layer 342) of the second portion 122 of the display 120 described in the disclosure may extend to form the third portion 123.

Figure 11:
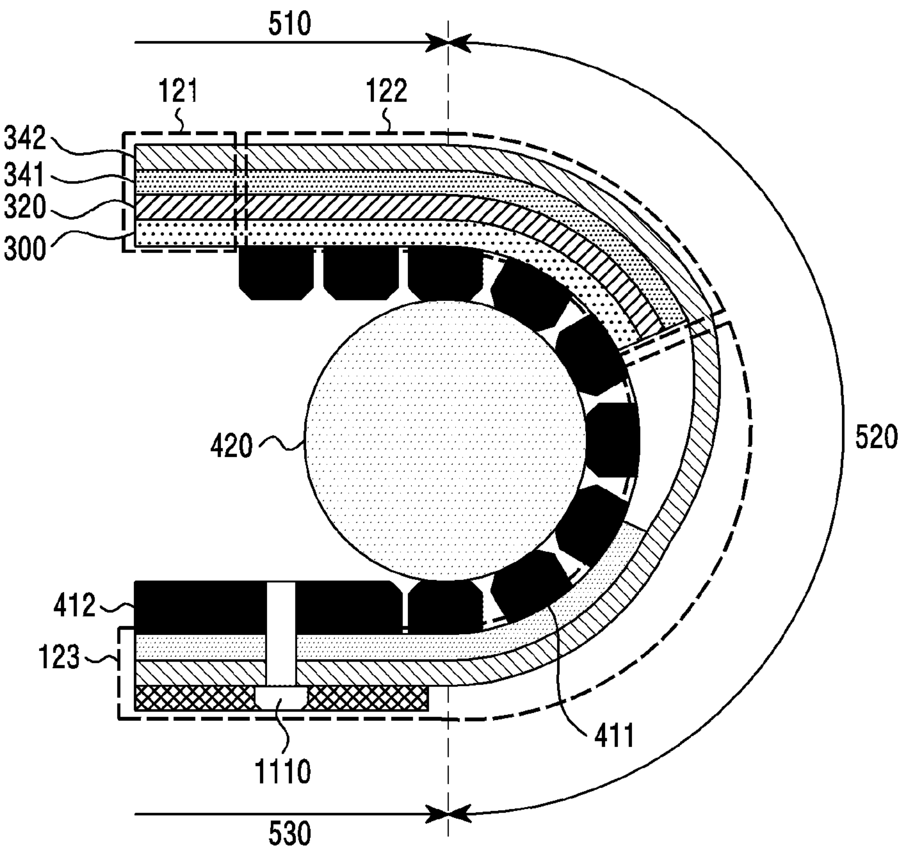
FIG. 11 is a sectional view illustrating a display structure having a fixing member connected thereto according to various embodiments.

FIG. 11 is a diagram illustrating an example display structure having a fixing member connected thereto according to various embodiments.

Referring to FIG. 11, the electronic device 100 according to an embodiment may include a fixing member (e.g., a fastener) 1110. In an embodiment, the fixing member 1110 may be connected to the third portion 123 of the display 120 to fix the third portion 123 of the display 120 to a flat region constructed by the support plate 412. The same/similar reference numerals are used for the same or substantially the same components as those described above, and redundant descriptions may not be repeated here.

The fixing member 1110 according to an embodiment may include a screw or a pin. In an embodiment, the fixing member 1110 may include a metal (e.g., stainless steel, copper, aluminum) or plastic. For example, a material of the fixing member 1110 may include an aluminum extruded material. In an embodiment, without being limited to the embodiment, the fixing member 1110 includes all members (e.g., fasteners) capable of fixing the display 120 to the flat region constructed by the support plate 412.

The fixing member 1110 according to an embodiment may be located in the third section 530 by being connected to the third portion 123 of the display 120 when the electronic device is converted from a first state (e.g., the first state 100*a* of FIG. 1A) to a second state (e.g., the second state 100*b* of FIG. 1B).

According to an embodiment, the third portion 123 of the display 120 to which the fixing member 1110 is connected may have various stacked structures. For example, the third portion 123 may include the cover layer 300, the panel layer 320, the first window layer 341, and the second window layer 342. In this case, the fixing member 1110 may be connected to the third portion 123 including the plurality of layers 300, 320, 341, and 342.

As another example, the third portion 123 may include the cover layer 300 and/or the first window layer 341. In this case, the fixing member 1110 may be connected to the third portion 123 including the plurality of layers 300 and 341.

Figure 12A:
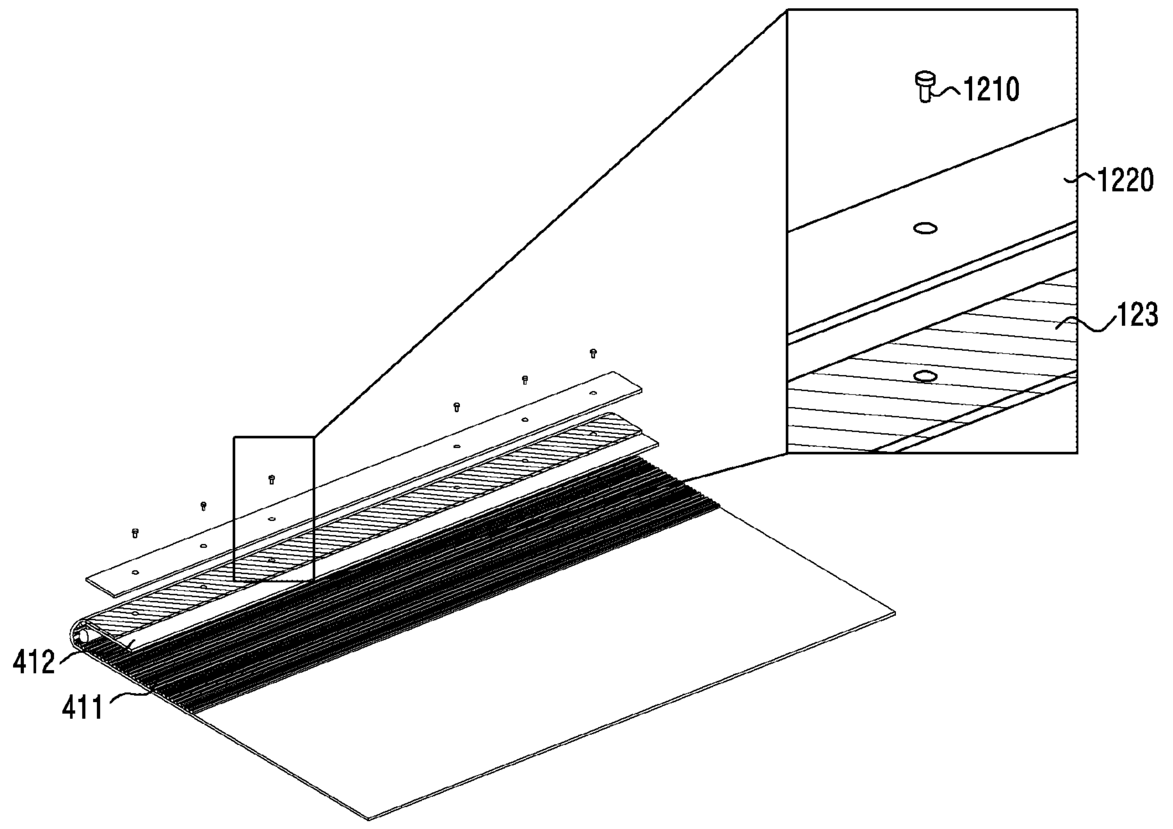
FIG. 12A is a diagram illustrating an example in which a display is directly fixed using a fixing member and a pressing member according to various embodiments.

FIG. 12A is a diagram illustrating an example in which a display is directly fixed using a fixing member and a pressing member according to various embodiments.

Figure 12B:
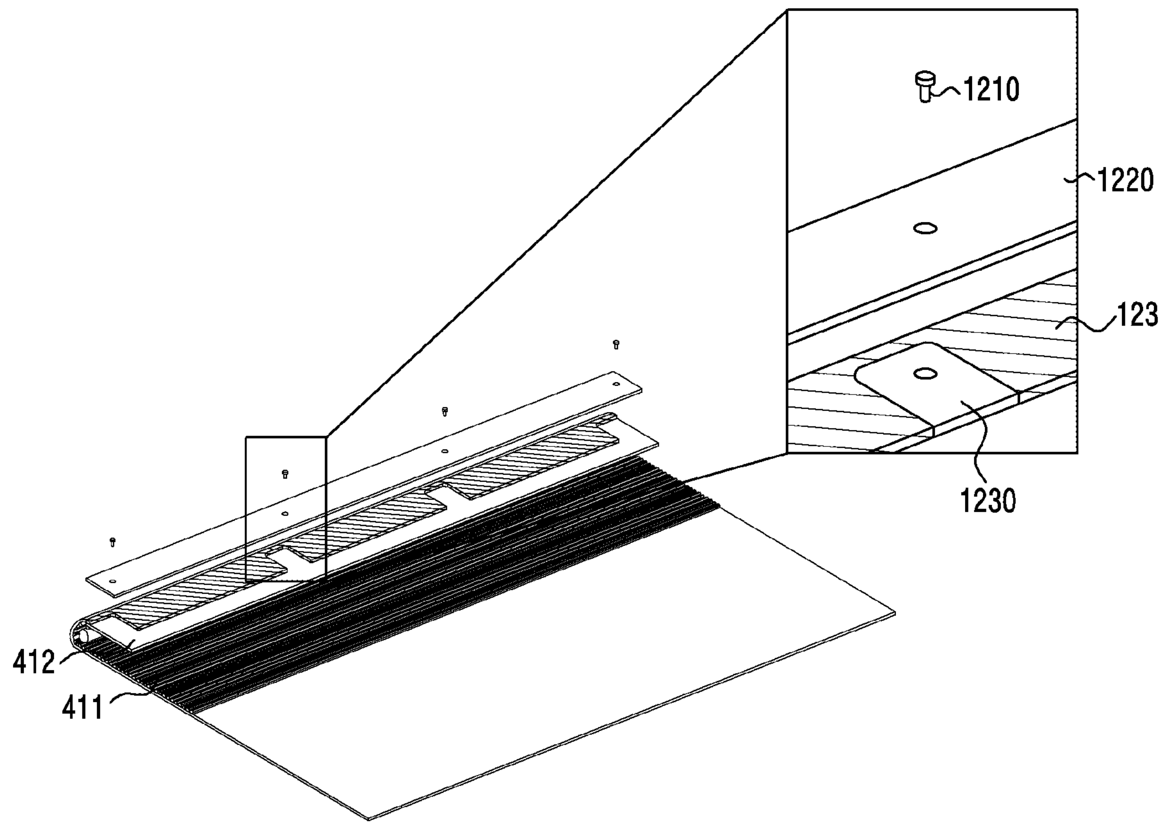
FIG. 12B is a diagram illustrating an example in which a display is indirectly fixed using a fixing member, a pressing member, and a mechanical member according to various embodiments.

FIG. 12B is a diagram illustrating an example in which a display is indirectly fixed using a fixing member, a pressing member, and a mechanical member according to various embodiments.

Figure 12C:
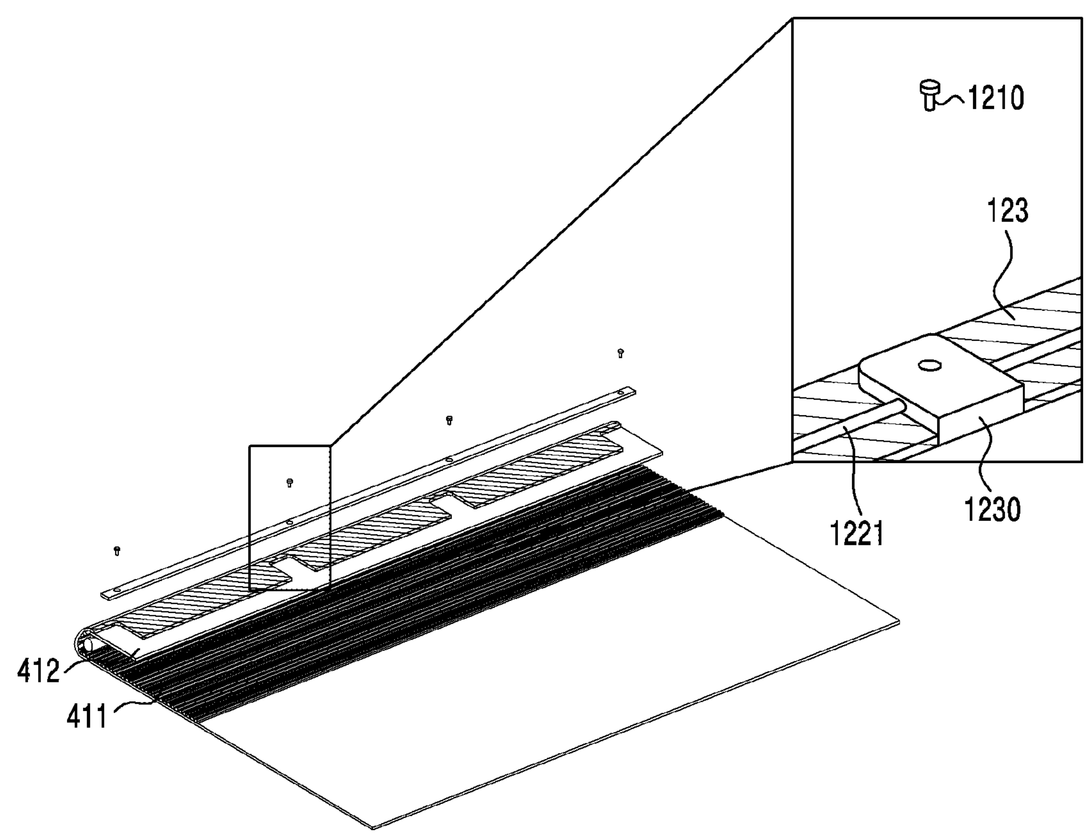
FIG. 12C is a diagram illustrating an example in which a display is fixed using a fixing member, a circular pressing member, and a mechanical member according to various embodiments.

FIG. 12C is a diagram illustrating an example in which a display is fixed using a fixing member, a circular pressing member, and a mechanical member according to various embodiments.

Referring to FIG. 12A, the electronic device 100 according to an embodiment may include a fixing member 1210 and a first pressing member 1220.

Referring to FIG. 12B and FIG. 12C, the electronic device 100 according to an embodiment may include the fixing member 1210, the first pressing member 1220, a second pressing member 1221, and/or a mechanical member 1230. The same/similar reference numerals are used for the same or substantially the same components as those described above, and redundant descriptions may not be repeated here.

Referring to FIG. 12A, FIG. 12B, and FIG. 12C, the fixing member 1210 according to an embodiment may be connected to the first pressing member 1220. With the fixing member 1210 being connected to the third portion 123 of the display 120, the first pressing member 1220 connected to the fixing member 1210 may also fix a region other than a region in which the fixing member 1210 and the third portion 123 are directly or indirectly fixed. For example, referring to FIG. 12A, the first pressing member 1220 may fix the third portion 123 of the display 120 in a region in which the first pressing member 1220 is disposed in addition to the region in which the fixing member 1210 and the third portion 123 of the display 120 are directly fixed. In an embodiment, the first pressing member 1220 may be replaced with the second pressing member 1221.

In an embodiment, the first pressing member 1220 and the second pressing member may be formed of a metal (e.g., copper, aluminum) or plastic.

The fixing member 1210 according to an embodiment may be directly or indirectly fixed to the third portion 123 of the display 120 depending on the disposition of the mechanical member 1230. For example, referring to FIG. 12B, the mechanical member 1230 may be inserted to a portion of the third portion 123 of the display 120, and the fixing member 1210 may be connected to the mechanical member 1230 while being connected to one portion of the first pressing member 1220, thereby indirectly fixing the third portion 123. As another example, referring to FIG. 12A, the fixing member 1210 may be directly connected to the third portion 123 of the display 120 while being connected to one portion of the first pressing member 1220, thereby fixing the third portion 123. In an embodiment, a case where the fixing member 1210 directly fixes the third portion 123 of the display 120 and a case of indirectly fixing it using the mechanical member 1230 may be simultaneously implemented.

According to an embodiment, the mechanical member 1230 may be disposed plural in number by being spaced apart along the third portion 123. The plurality of mechanical members 1230 may be connected to the plurality of fixing members 1210 and the plurality of first pressing members 1220 so that the third portion 123 is fixed to the support plate 421 in the plurality of regions of the third portion 123. In an embodiment, the first pressing member 1220 may be replaced with the second pressing member 1221.

The pressing members 1220 and 1221 according to an embodiment may have various configurations. For example, referring to FIG. 12A, the first pressing member 1220, which has a rectangular panel shape, may fix the third portion 123 of the display 120. As an embodiment, referring to FIG. 12C, the second pressing member 1221, which has a circular shape, may fix the third portion 123 of the display 120.

Figure 13A:
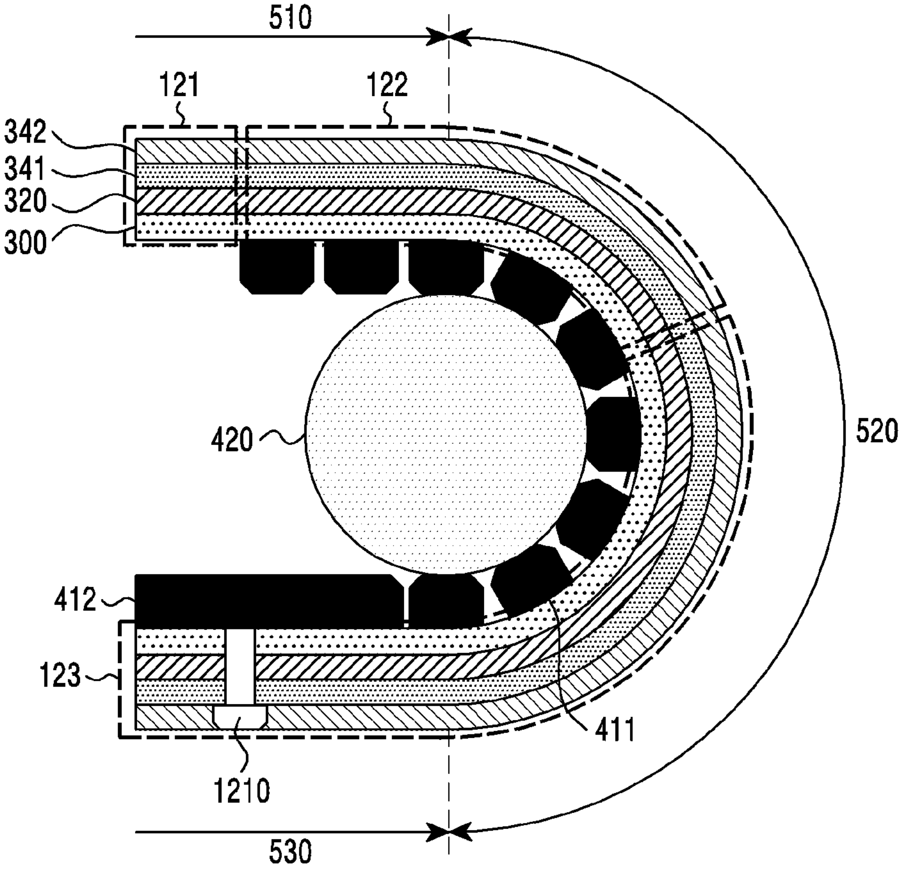
FIG. 13A is a sectional view illustrating an example in which a fixing member is connected to a display according to various embodiments.

FIG. 13A is a sectional view illustrating an example in which a fixing member is connected to a display according to various embodiments.

Figure 13B:
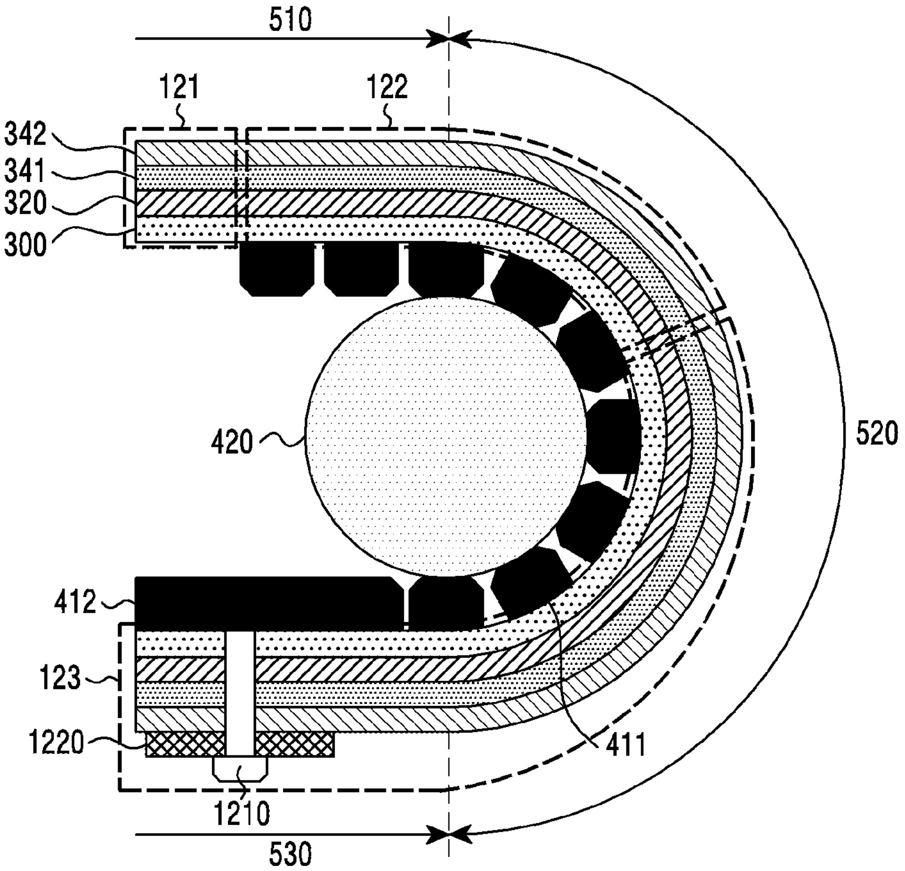
FIG. 13B is a sectional view illustrating an example of direct fixing in which a fixing member and a pressing member are connected to a display according to various embodiments.

FIG. 13B is a sectional view illustrating an example of direct fixing in which a fixing member and a pressing member are connected to a display according to various embodiments.

Figure 13C:
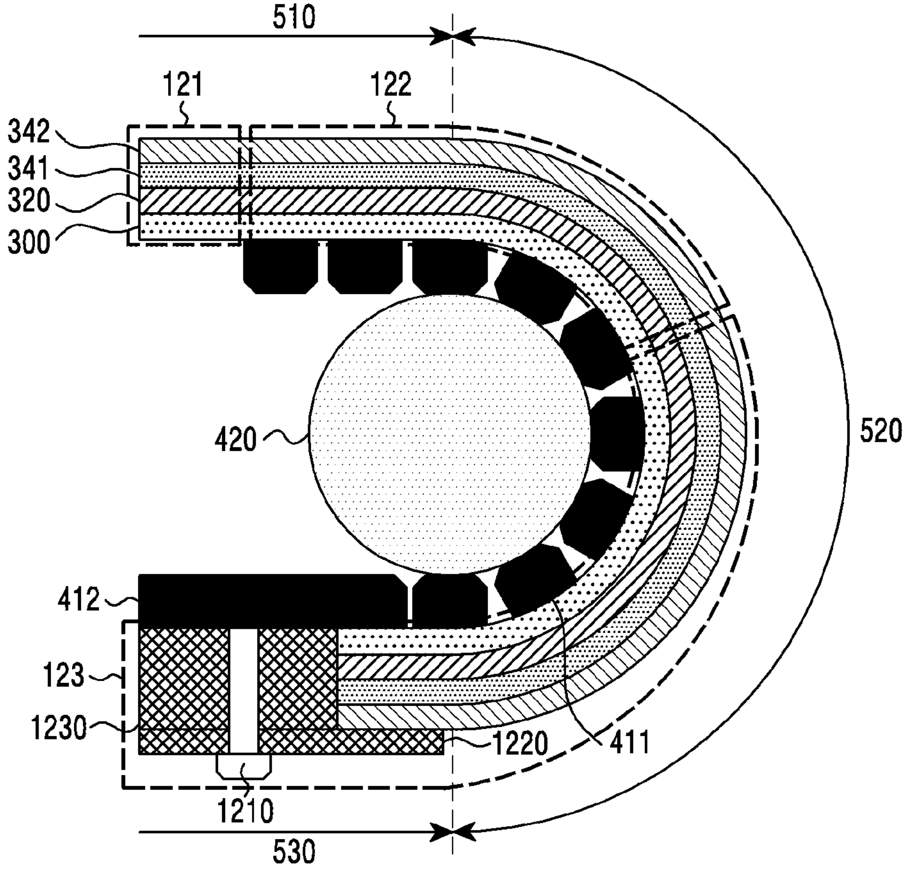
FIG. 13C is a sectional view illustrating an example of indirect fixing in which a fixing member, a pressing member, and a mechanical member are used to fix a display according to various embodiments.

FIG. 13C is a sectional view illustrating an example of indirect fixing in which a fixing member, a pressing member, and a mechanical member are used to fix a display according to various embodiments.

Figure 13D:
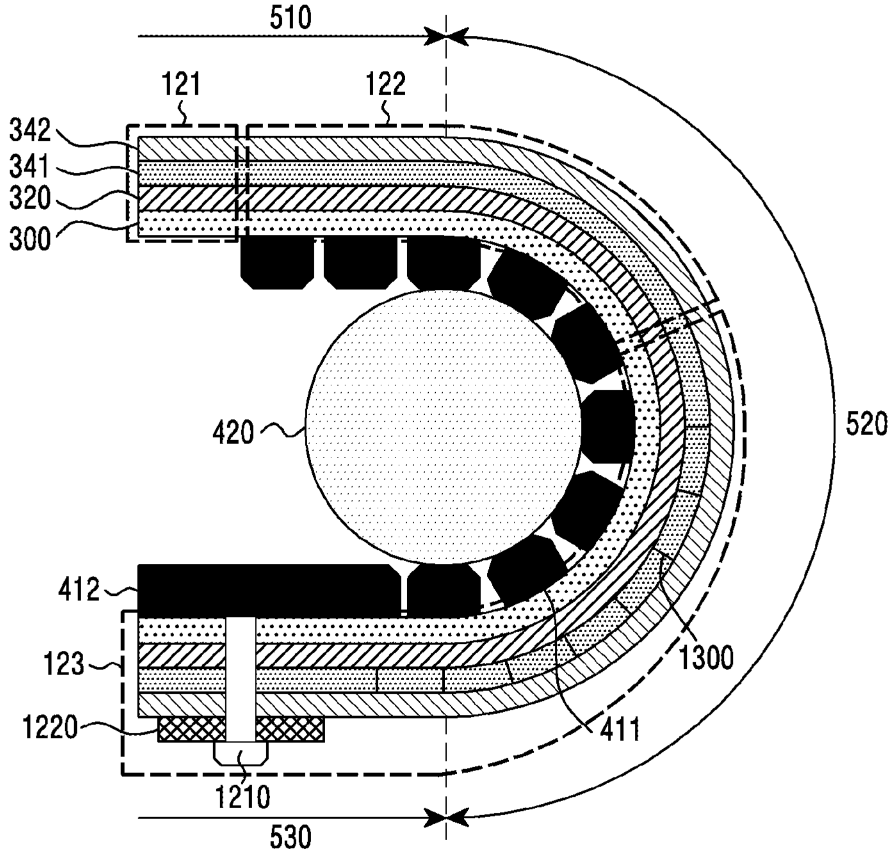
FIG. 13D is a sectional view illustrating an example in which a slit structure is added to a display according to various embodiments.

FIG. 13D is a sectional view illustrating an example in which a slit structure is added to a display according to various embodiments.

Referring to FIG. 13D, in an embodiment, the display 120 may include the cover layer 300, the panel layer 320, the first window layer 341, and the second window layer 342, and at least one of the plurality of layers 300, 320, 341, and 342 may include a slit structure 1300. The same/similar reference numerals are used for the same or substantially the same components as those described above, and redundant descriptions may not be repeated here.

Referring to FIG. 13A, in an embodiment, the fixing member 1210 may be connected to one portion of the plurality of layers 300, 320, 341, and 342 of the third portion 123 of the display 120 and may be connected to the support plate 412 of a flat region, so that the third portion 123 of the display 120 is fixed to the support plate 412.

In an embodiment, at least one layer among the plurality of layers 300, 320, 341, and 342 of the second portion 122 of the display 120 may extend up to the third portion 123 of the display 120, and may be connected to the fixing member 1210.

In an embodiment, the fixing member 1210 and the third portion 123 of the display 120 connected to the fixing member 1210 may move along the third section 530 of the third portion 123 when the electronic device is converted from a first state (e.g., the first state 100*a* of FIG. 1A) to a second state (e.g., the second state 100*b* of FIG. 1B).

In an embodiment, in the second state (e.g., the second state 100*b* of FIG. 1B), the fixing member 1210 may be located in the third section 530.

In an embodiment, a plurality of fixing members 1210 may fix the third portion 123 by being connected to the third portion 123 of the display 120 and the support plate 412 in a plurality of regions along the third portion 123 of the display 120.

Referring to FIG. 13B, the fixing member 1210 according to an embodiment may be connected to the first pressing member 1220 to have an effect of fixing the third portion 123 also in a region of the third portion 123, which is connected to the fixing member 1210. For example, the fixing member 1210 may be connected to one portion of the first pressing member 1220, and may be connected to the third portion 123 of the display 120. The first pressing member 1220 may also press a region other than one region connected to the fixing member 1210 to have an effect of fixing to the support plate 412. As an embodiment, the first pressing member 1220 may be replaced with a second pressing member (e.g., the second pressing member 1221 of FIG. 12C).

Referring to FIG. 13C, in an embodiment, the mechanical member 1230 may be disposed by being inserted to the third portion 123 of the display 120 or by being connected to the third portion 123. In an embodiment, the mechanical member 1230 inserted to the third portion 123 of the display 120 may be connected to the fixing member 1210 so that the fixing member 1210 allows the third portion 123 to be indirectly connected to a flat region of the support plate 412, instead of being directly connected to the third portion 123 of the display 120. In an embodiment, when the mechanical member 1230 is inserted to the third portion 123 or is connected to the third portion 123, an adhesive or a resin may be used for the connection.

According to an embodiment, the mechanical member 1230 may include a metal (e.g., copper, aluminum) or plastic, and without being limited thereto, includes a mechanical member that can be connected to the fixing member 1210 and the display 120.

Referring to FIG. 13D, at least one layer among the plurality of layers 300, 320, 341, and 342 of the third portion 123 of the display 120 according to an embodiment may include a slit structure 1300.

According to an embodiment, the slit structure 1300 may be disposed spaced apart to minimize and/or reduce frictional force when the display 120 moves.

Figure 14A:
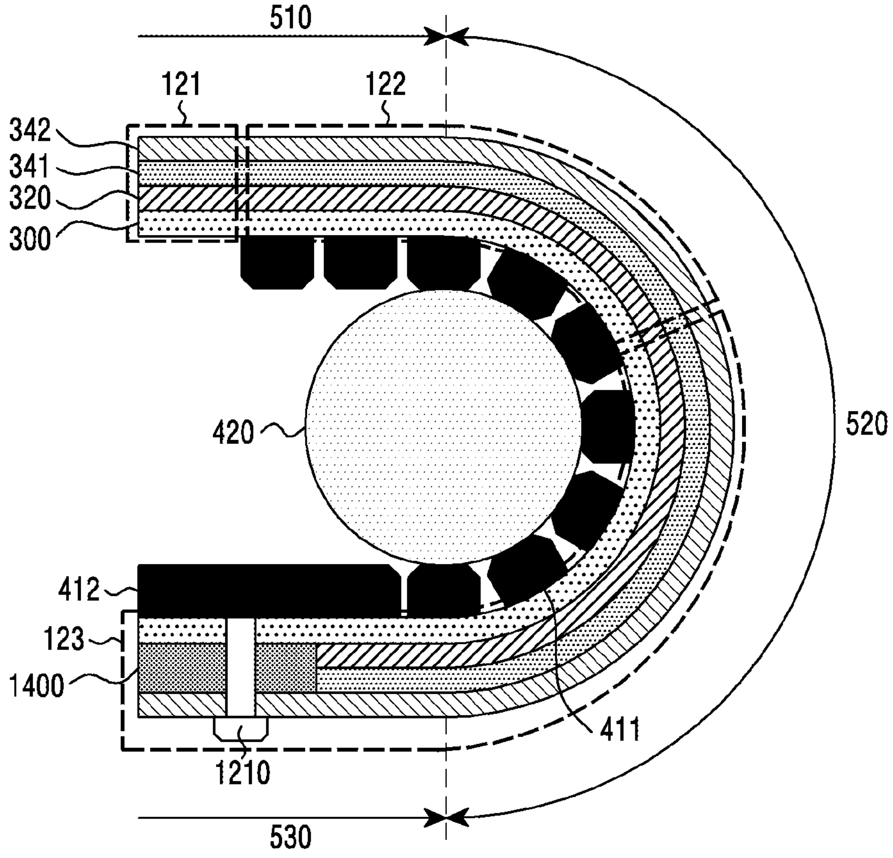
FIG. 14A is a sectional view illustrating an example in which a fixing member is connected to a display including an adhesive layer according to various embodiments.

FIG. 14A is a sectional view illustrating an example in which a fixing member is connected to a display including an adhesive layer according to various embodiments.

Figure 14B:
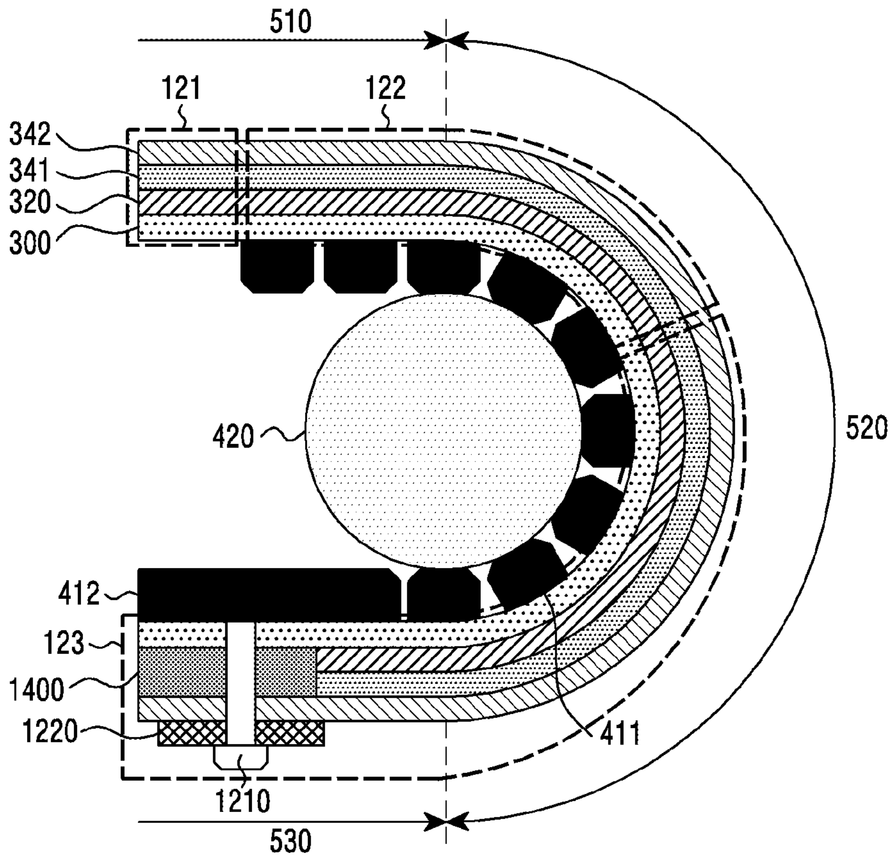
FIG. 14B is a sectional view illustrating an example of direct fixing in which a fixing member and a pressing member are connected to a display including an adhesive layer according to various embodiments.

FIG. 14B is a sectional view illustrating an example of direct fixing in which a fixing member and a pressing member are connected to a display including an adhesive layer according to various embodiments.

Figure 14C:
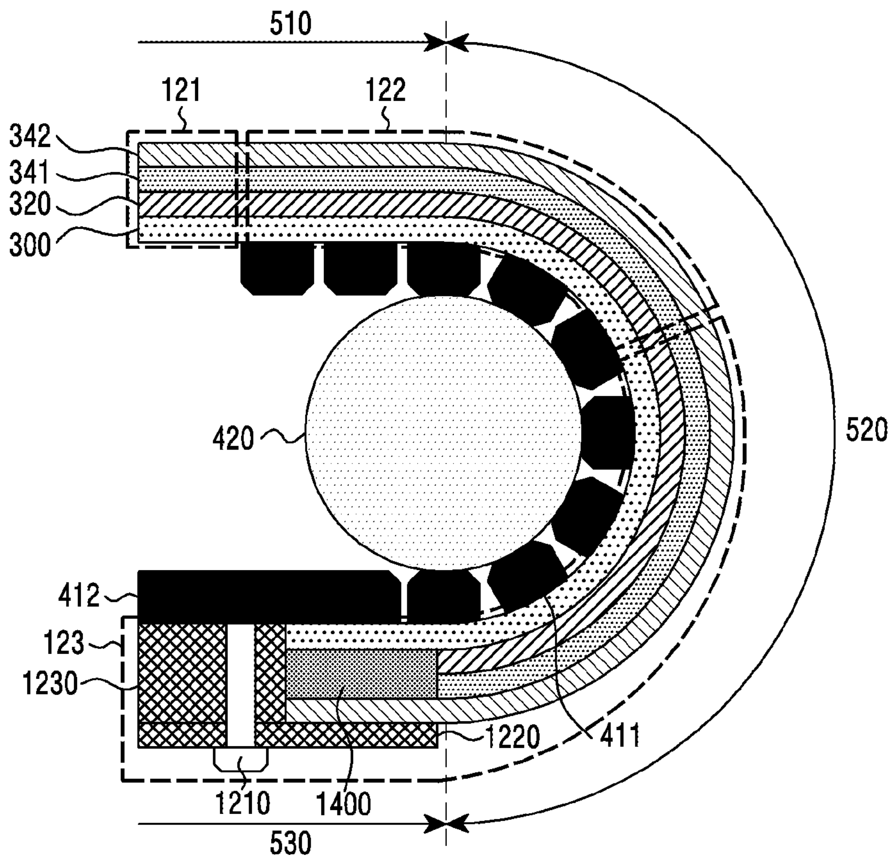
FIG. 14C is a sectional view illustrating an example of indirect fixing in which a fixing member, a pressing member, and a mechanical member are used to fix a display including an adhesive layer according to various embodiments.

FIG. 14C is a sectional view illustrating an example of indirect fixing in which a fixing member, a pressing member, and a mechanical member are used to fix a display including an adhesive layer according to various embodiments.

Figure 14D:
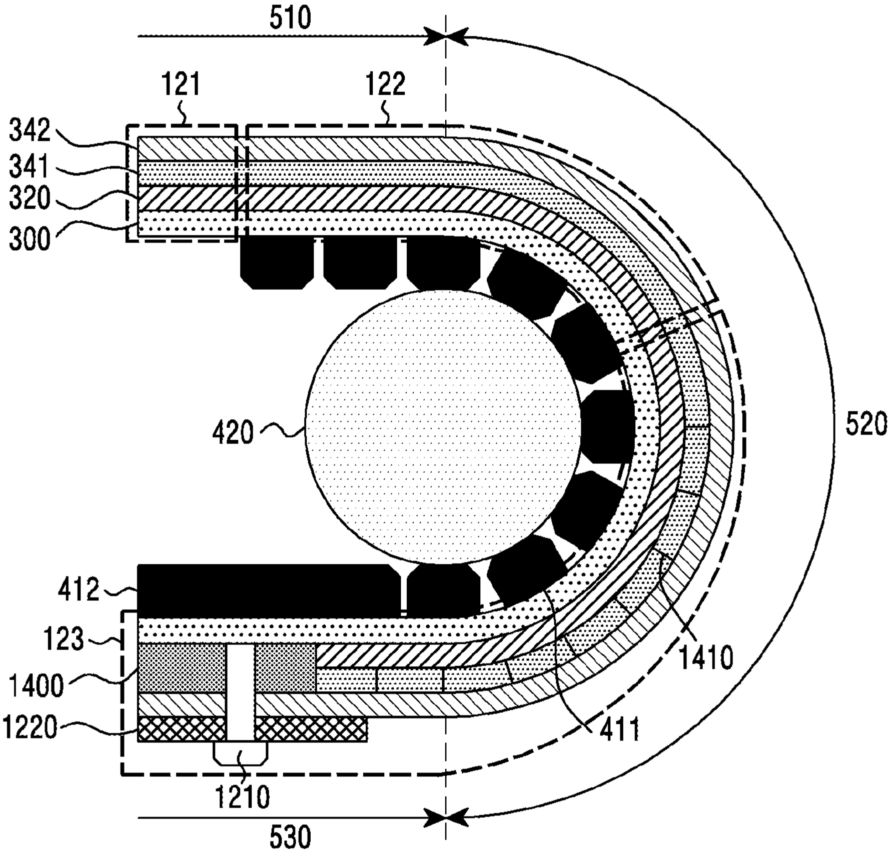
FIG. 14D is a sectional view illustrating an embodiment in which a slit structure is added to a display including an adhesive layer according to various embodiments.

FIG. 14D is a sectional view illustrating an example in which a slit structure is added to a display including an adhesive layer according to various embodiments.

Referring to FIG. 14A, FIG. 14B, FIG. 14C, and FIG. 14D, the third portion 123 of the display 120 may include an adhesive layer 1400.

Referring to FIG. 14A, at least part of the third portion 123 of the display 120 according to an embodiment may include the adhesive layer 1400. For example, part of the third portion 123 of the display 120 may include the adhesive layer 1400, and the fixing member 1210 may be connected to the adhesive layer 1400 included in the third portion 123 so that the third portion 123 is fixed to the support plate 412.

As another example, the fixing member 1210 may be connected to a portion not belonging to the adhesive layer 1400 in the third portion 123 including the adhesive layer 1400, so that the third portion 123 is fixed to the support plate 412.

As another example, some members of the plurality of fixing members 120 may be connected to the adhesive layer 1400 of the third portion 123, and other members thereof may be connected to a portion other than the adhesive layer 1400, thereby fixing the third portion 123 of the display 120 to the support plate 421.

Referring to FIG. 14B, the first pressing member 1220 according to an embodiment may be connected to the fixing member 1210 to press the adhesive layer 1400, thereby fixing the third portion 123 of the display 120.

Referring to FIG. 14C, the mechanical member 1230 according to an embodiment may be connected to the adhesive layer 1400. For example, the mechanical member 1230 may be inserted to the third portion 123 so as to abut against the adhesive layer 1400, thereby being connected by means of a bonding material.

In an embodiment, instead of being directly connected to the third portion 123 of the display 120 including the adhesive layer 1400, the fixing member 1210 may be connected to the mechanical member 1230 and the support plate 421, thereby directly fixing the third portion 123 of the display 120 to the support plate 412.

Referring to FIG. 14D, at least one layer among the plurality of layers 300, 320, 341, and 342 of the third portion 123 of the display 120 according to an embodiment may include a slit structure 1410. In an embodiment, the slit structure 1410 may also be formed in the adhesive layer 1400.

According to an embodiment, the slit structure 1410 may be disposed spaced apart from the third portion 123 of the display 120, thereby minimizing and/or reducing frictional force when the display 120 moves.

Figure 15:
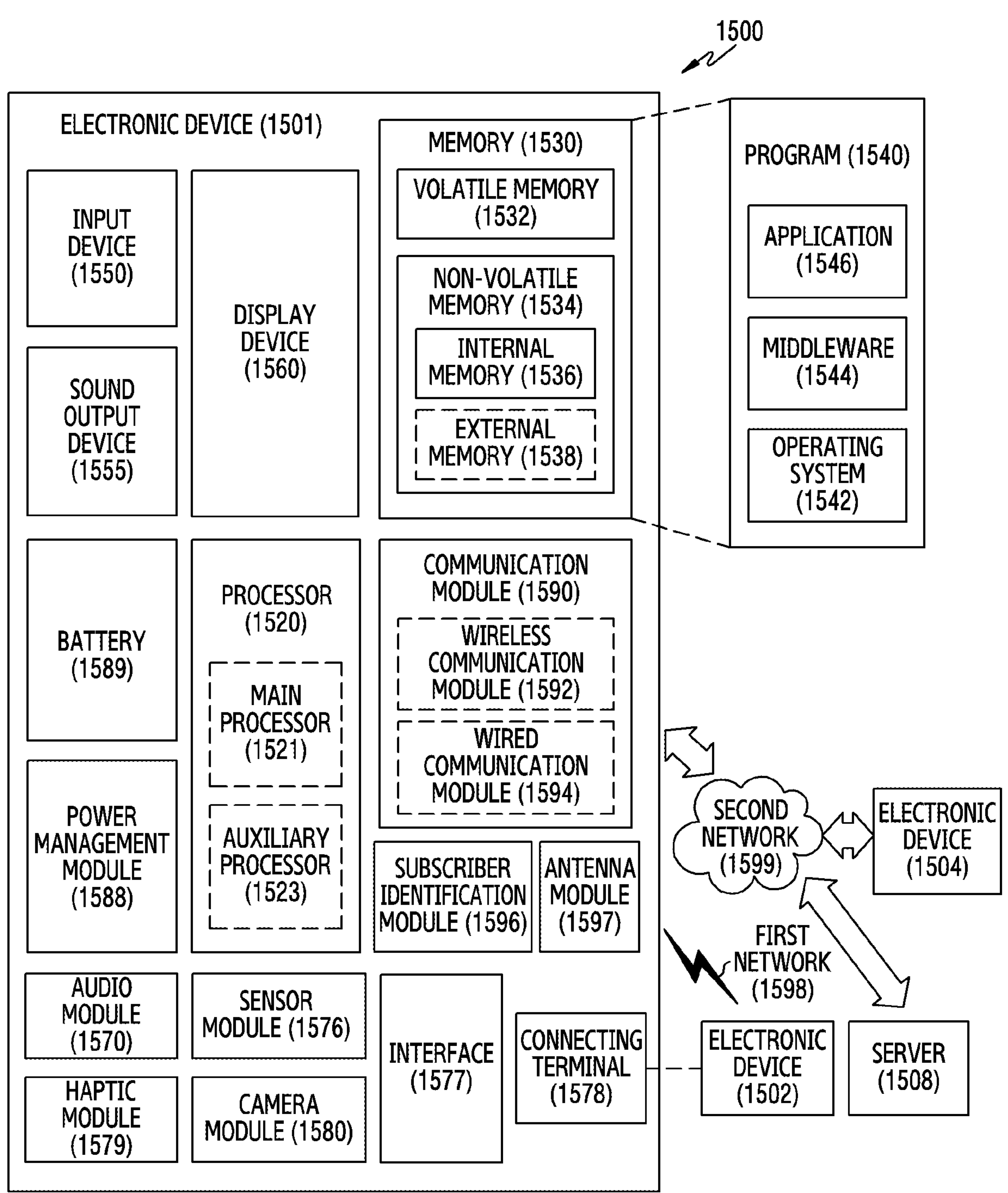
FIG. 15 is a block diagram illustrating an example electronic device in a network environment, according to various embodiments.

FIG. 15 is a block diagram illustrating an example electronic device 1501 in a network environment 1500 according to various embodiments. Referring to FIG. 15, the electronic device 1501 in the network environment 1500 may communicate with an electronic device 1502 via a first network 1598 (e.g., a short-range wireless communication network), or at least one of an electronic device 1504 or a server 1508 via a second network 1599 (e.g., a long-range wireless communication network). According to an embodiment, the electronic device 1501 may communicate with the electronic device 1504 via the server 1508. According to an embodiment, the electronic device 1501 may include a processor 1520, memory 1530, an input module 1550, a sound output module 1555, a display module 1560, an audio module 1570, a sensor module 1576, an interface 1577, a connecting terminal 1578, a haptic module 1579, a camera module 1580, a power management module 1588, a battery 1589, a communication module 1590, a subscriber identification module (SIM) 1596, or an antenna module 1597. In various embodiments, at least one of the components (e.g., the connecting terminal 1578) may be omitted from the electronic device 1501, or one or more other components may be added in the electronic device 1501. In various embodiments, some of the components (e.g., the sensor module 1576, the camera module 1580, or the antenna module 1597) may be implemented as a single component (e.g., the display module 1560).

The processor 1520 may execute, for example, software (e.g., a program 1540) to control at least one other component (e.g., a hardware or software component) of the electronic device 1501 coupled with the processor 1520, and may perform various data processing or computation. According to an embodiment, as at least part of the data processing or computation, the processor 1520 may store a command or data received from another component (e.g., the sensor module 1576 or the communication module 1590) in volatile memory 1532, process the command or the data stored in the volatile memory 1532, and store resulting data in non-volatile memory 1534. According to an embodiment, the processor 1520 may include a main processor 1521 (e.g., a central processing unit (CPU) or an application processor (AP)), or an auxiliary processor 1523 (e.g., a graphics processing unit (GPU), a neural processing unit (NPU), an image signal processor (ISP), a sensor hub processor, or a communication processor (CP)) that is operable independently from, or in conjunction with, the main processor 1521. For example, when the electronic device 1501 includes the main processor 1521 and the auxiliary processor 1523, the auxiliary processor 1523 may be adapted to consume less power than the main processor 1521, or to be specific to a specified function. The auxiliary processor 1523 may be implemented as separate from, or as part of the main processor 1521.

The auxiliary processor 1523 may control at least some of functions or states related to at least one component (e.g., the display module 1560, the sensor module 1576, or the communication module 1590) among the components of the electronic device 1501, instead of the main processor 1521 while the main processor 1521 is in an inactive (e.g., sleep) state, or together with the main processor 1521 while the main processor 1521 is in an active state (e.g., executing an application). According to an embodiment, the auxiliary processor 1523 (e.g., an image signal processor or a communication processor) may be implemented as part of another component (e.g., the camera module 1580 or the communication module 1590) functionally related to the auxiliary processor 1523. According to an embodiment, the auxiliary processor 1523 (e.g., the neural processing unit) may include a hardware structure specified for artificial intelligence model processing. An artificial intelligence model may be generated by machine learning. Such learning may be performed, e.g., by the electronic device 1501 where the artificial intelligence is performed or via a separate server (e.g., the server 1508). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1530 may store various data used by at least one component (e.g., the processor 1520 or the sensor module 1576) of the electronic device 1501. The various data may include, for example, software (e.g., the program 1540) and input data or output data for a command related thereto. The memory 1530 may include the volatile memory 1532 or the non-volatile memory 1534.

The program 1540 may be stored in the memory 1530 as software, and may include, for example, an operating system (OS) 1542, middleware 1544, or an application 1546.

The input module 1550 may receive a command or data to be used by another component (e.g., the processor 1520) of the electronic device 1501, from the outside (e.g., a user) of the electronic device 1501. The input module 1550 may include, for example, a microphone, a mouse, a keyboard, a key (e.g., a button), or a digital pen (e.g., a stylus pen).

The sound output module 1555 may output sound signals to the outside of the electronic device 1501. The sound output module 1555 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1560 may visually provide information to the outside (e.g., a user) of the electronic device 1501. The display module 1560 may include, for example, a display, a hologram device, or a projector and control circuitry to control a corresponding one of the display, hologram device, and projector.

According to an embodiment, the display module 1560 may include a touch sensor adapted to detect a touch, or a pressure sensor adapted to measure the intensity of force incurred by the touch.

The audio module 1570 may convert a sound into an electrical signal and vice versa. According to an embodiment, the audio module 1570 may obtain the sound via the input module 1550, or output the sound via the sound output module 1555 or a headphone of an external electronic device (e.g., an electronic device 1502) directly (e.g., wiredly) or wirelessly coupled with the electronic device 1501.

The sensor module 1576 may detect an operational state (e.g., power or temperature) of the electronic device 1501 or an environmental state (e.g., a state of a user) external to the electronic device 1501, and then generate an electrical signal or data value corresponding to the detected state. According to an embodiment, the sensor module 1576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1577 may support one or more specified protocols to be used for the electronic device 1501 to be coupled with the external electronic device (e.g., the electronic device 1502) directly (e.g., wiredly) or wirelessly. According to an embodiment, the interface 1577 may include, for example, a high definition multimedia interface (HDMI), a universal serial bus (USB) interface, a secure digital (SD) card interface, or an audio interface.

A connecting terminal 1578 may include a connector via which the electronic device 1501 may be physically connected with the external electronic device (e.g., the electronic device 1502). According to an embodiment, the connecting terminal 1578 may include, for example, a HDMI connector, a USB connector, a SD card connector, or an audio connector (e.g., a headphone connector).

The haptic module 1579 may convert an electrical signal into a mechanical stimulus (e.g., a vibration or a movement)

or electrical stimulus which may be recognized by a user via his tactile sensation or kinesthetic sensation. According to an embodiment, the haptic module 1579 may include, for example, a motor, a piezoelectric element, or an electric stimulator.

The camera module 1580 may capture a still image or moving images. According to an embodiment, the camera module 1580 may include one or more lenses, image sensors, image signal processors, or flashes.

The power management module 1588 may manage power supplied to the electronic device 1501. According to an embodiment, the power management module 1588 may be implemented as at least part of, for example, a power management integrated circuit (PMIC).

The battery 1589 may supply power to at least one component of the electronic device 1501. According to an embodiment, the battery 1589 may include, for example, a primary cell which is not rechargeable, a secondary cell which is rechargeable, or a fuel cell.

The communication module 1590 may support establishing a direct (e.g., wired) communication channel or a wireless communication channel between the electronic device 1501 and the external electronic device (e.g., the electronic device 1502, the electronic device 1504, or the server 1508) and performing communication via the established communication channel. The communication module 1590 may include one or more communication processors that are operable independently from the processor 1520 (e.g., the application processor (AP)) and supports a direct (e.g., wired) communication or a wireless communication. According to an embodiment, the communication module 1590 may include a wireless communication module 1592 (e.g., a cellular communication module, a short-range wireless communication module, or a global navigation satellite system (GNSS) communication module) or a wired communication module 1594 (e.g., a local area network (LAN) communication module or a power line communication (PLC) module). A corresponding one of these communication modules may communicate with the external electronic device via the first network 1598 (e.g., a short-range communication network, such as Bluetooth™, wireless-fidelity (Wi-Fi) direct, or infrared data association (IrDA)) or the second network 1599 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1592 may identify and authenticate the electronic device 1501 in a communication network, such as the first network 1598 or the second network 1599, using subscriber information (e.g., international mobile subscriber identity (IMSI)) stored in the subscriber identification module 1596.

The wireless communication module 1592 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1592 may support a high-frequency band (e.g., the mmWave band) to achieve, e.g., a high data transmission rate. The wireless communication module 1592 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1592 may support various requirements specified in the electronic device 1501, an external electronic device (e.g., the electronic device 1504), or a network system (e.g., the second network 1599). According to an embodiment, the wireless communication module 1592 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1597 may transmit or receive a signal or power to or from the outside (e.g., the external electronic device) of the electronic device 1501. According to an embodiment, the antenna module 1597 may include an antenna including a radiating element including a conductive material or a conductive pattern formed in or on a substrate (e.g., a printed circuit board (PCB)). According to an embodiment, the antenna module 1597 may include a plurality of antennas (e.g., array antennas). In such a case, at least one antenna appropriate for a communication scheme used in the communication network, such as the first network 1598 or the second network 1599, may be selected, for example, by the communication module 1590 (e.g., the wireless communication module 1592) from the plurality of antennas. The signal or the power may then be transmitted or received between the communication module 1590 and the external electronic device via the selected at least one antenna. According to an embodiment, another component (e.g., a radio frequency integrated circuit (RFIC)) other than the radiating element may be additionally formed as part of the antenna module 1597.

According to various embodiments, the antenna module 1597 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1501 and the external electronic device 1504 via the server 1508 coupled with the second network 1599. Each of the electronic devices 1502 or 1504 may be a device of a same type as, or a different type, from the electronic device 1501. According to an embodiment, all or some of operations to be executed at the electronic device 1501 may be executed at one or more of the external electronic devices 1502, 1504, or 1508. For example, if the electronic device 1501 should perform a function or a service automatically, or in response to a request from a user or another device, the electronic device 1501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1501. The electronic device 1501 may provide the outcome, with or without further processing of the outcome, as at least part of a reply to the request. To that end, a cloud computing, distributed computing, mobile edge computing (MEC), or client-server computing technology may be used, for example. The electronic device 1501 may provide ultra low-latency services using, e.g., distributed computing or mobile edge computing. In an embodiment, the external electronic device 1504 may include an internet-of-things (IoT) device. The server 1508 may be an intelligent server using machine learning and/or a neural network. According to an embodiment, the external electronic device 1504 or the server 1508 may be included in the second network 1599. The electronic device 1501 may be applied to intelligent services (e.g., smart home, smart city, smart car, or health-care) based on 5G communication technology or IoT-related technology.

According to an example embodiment, an electronic device may include: a housing including a first housing including a side surface and rear surface of the electronic device and a second housing coupled to the first housing in a slidable manner, a flexible display having at least one region viewable from the outside of the electronic device through a front surface of the electronic device, and a roller unit comprising a roller disposed inside the housing. The flexible display may be movable along a first section corresponding to a front surface of the electronic device, a second section extending from the first section and surrounding the roller unit, and a third section extending from the second section to the inside of the housing. The flexible display may include a first portion, a second portion extending from the first portion in a first direction, and a third portion extending from the second portion. The second portion may be drawn into the inside of the first housing by sliding of the second housing in the first direction when the electronic device is converted from a second state to a first state, and may be drawn out from the inside of the first housing by sliding of the second housing in a second direction opposite to the first direction when the electronic device is converted from the first state to the second state. The third portion may be fixed to a flat region of the third section in the first state.

According to an example embodiment, the first portion and second portion of the flexible display may include a plurality of layers. At least one of the plurality of layers may extend up to the third portion.

According to an example embodiment, the plurality of layers may include a flexible substrate, a display panel, a polarization layer, and at least one window layer.

According to an example embodiment, the third portion of the flexible display may include a layer including a plurality of slits spaced apart.

According to an example embodiment, a first layer of the third portion of the flexible display may form an adhesive layer. The adhesive layer may be form in at least part of the third portion.

According to an example embodiment, the adhesive layer included in the third portion may include a plurality of slits that are spaced apart.

According to an example embodiment, the plurality of layers of the first portion and second portion may include a first window layer and a second window layer. At least one of the first window layer and the second window layer may extend up to the third portion.

According to an example embodiment, a region of the third portion of the flexible display may form a dummy region.

According to an example embodiment, the plurality of layers of the first portion and second portion may further include a cover layer. The cover layer may extend up to the third portion.

The electronic device according to various example embodiments may further include bars and a support plate. The bars may be attached to a rear surface of the second portion and third portion of the flexible display. The support plate may be attached to the rear surface of the third portion of the flexible display.

According to an example embodiment, the roller unit may abut against the bars connected to a rear surface of the flexible display and is configured to move the flexible display along the first section, the second section, and the third section, when the electronic device is converted from the first state to the second state.

According to an example embodiment, the roller unit may be configured to allow at least part of the third portion of the flexible display to be located in the flat region of the third section when in the second state.

According to an example embodiment, the support plate may form at least part of the flat region in the third section.

The electronic device according to an example embodiment may further include a fixing member (e.g., fastener). The fixing member comprising a fastener may be connected to the support plate and the third portion so that the third portion is fixed to the support plate.

The electronic device according to an example embodiment may further include a pressing member (e.g., a rigid piece). The pressing member comprising a substantially rigid piece may be disposed abutting against the third portion of the flexible display. The pressing member may be connected to the fixing member.

The electronic device according to an example embodiment may include: a housing including a first housing including a side surface and rear surface of the electronic device and a second housing coupled to the first housing in a slidable manner, a flexible display having at least one region viewed from the outside of the electronic device through a front surface of the electronic device, a fixing member comprising a fastener, and a roller unit comprising a roller disposed inside the housing. The flexible display may be movable along a first section corresponding to the front surface of the electronic device, a second section extending from the first section and surrounding the roller unit, and a third section extending from the second section to the inside of the housing. The flexible display may include a first portion, a second portion extending from the first portion in a first direction, and a third portion extending from the second portion. The second portion may be drawn into the inside of the first housing by sliding of the second housing in the first direction when the electronic device is converted from a second state to a first state, and may be drawn out from the inside of the first housing by sliding of the second housing in a second direction opposite to the first direction when the electronic device is converted from the first state to the second state. The third portion may be fixed by being connected to a fixing member comprising a fastener in a flat region of the third section in the first state, may include a dummy region in at least one region, and may include at least one adhesive layer.

The electronic device according to an example embodiment may further include a pressing member comprising a substantially rigid piece inside the housing. The pressing member may be disposed by abutting against the third portion of the flexible display. The pressing member may be connected to the fixing member.

The electronic device according to an example embodiment may further include a mechanical member comprising a rigid piece inside the housing. The mechanical member may be fixed by being inserted to the third portion, and may be connected to the fixing member and the pressing member.

According to an example embodiment, the first portion and second portion of the flexible display may include a plurality of layers. At least one of the plurality of layers may extend up to the third portion. The third portion may include a layer including a plurality of slits spaced apart.

According to an example embodiment, the electronic device may further include bars and a support plate. The bars may be attached to a rear surface of the second portion and third portion of the flexible display. The support plate may be attached to the rear surface of the third portion of the flexible display.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1540) including one or more instructions that are stored in a storage medium (e.g., internal memory 1536 or external memory 1538) that is readable by a machine (e.g., the electronic device 1501). For example, a processor (e.g., the processor 1520) of the machine (e.g., the electronic device 1501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:

a slidable housing including a first housing and a second housing configured to move with respect to the first housing between a slide-in state and a slide-out state; and a flexible display disposed in the slidable housing, and including a first portion exposed to a front side of the slidable housing in the slide-out state and a second portion which is not exposed to the front side of the slidable housing in the slide-out state, wherein the first portion includes a plurality of layers including a window layer, a panel layer, and a bonding layer, wherein at least one layer including the panel layer among the plurality of layers is removed in the second portion and an adhesive layer distinct from the bonding layer is included in the second portion in replacement of the removed at least one layer, and wherein the adhesive layer has a thickness corresponding to the removed at least one layer and is extended to an end of the flexible display.

2. The electronic device of claim 1, wherein the plurality of layers include a flexible substrate, the panel layer, a polarization layer, and the window layer.

3. The electronic device of claim 1, wherein the adhesive layer includes a plurality of slits spaced apart.

4. The electronic device of claim 1, wherein the adhesive layer included in the second portion is disposed under the window layer, and wherein the adhesive layer is not included in the first portion.

5. The electronic device of claim 1, wherein the window layer includes a first window layer and a second window layer, and wherein at least one of the first window layer or the second window layer extends to the end of the flexible display.

6. The electronic device of claim 1, wherein the second portion of the flexible display includes a dummy region.

7. The electronic device of claim 1, wherein the plurality of layers further comprise a cover layer, and wherein the cover layer extends to the second portion.

8. The electronic device of claim 1, further comprising bars; and a support plate, wherein the bars are attached to a rear face of the first portion and a rear face of the second portion, and wherein the support plate is attached to the rear face of the second portion of the flexible display.

9. The electronic device of claim 8, further comprising:

a roller for moving the flexible display, wherein the flexible display is movable along a first section corresponding to the front side, a second section extending from the first section and surrounding the roller, and a third section extending from the second section to an inside of the slidable housing, and wherein the roller abuts against the bars and is configured to move the flexible display along the first section, the second section, and the third section.

10. The electronic device of claim 9, wherein at least a portion of the second portion of the flexible display is located in a flat region of the third section.

11. The electronic device of claim 10, wherein the support plate forms at least a portion of the flat region of the third section.

12. The electronic device of claim 8, further comprising:

a fixing member comprising a fastener, wherein the fixing member is coupled to the support plate and the second portion such that the second portion is fixed to the support plate.

13. The electronic device of claim 12, further comprising:

a pressing member comprising a rigid piece, wherein the pressing member is disposed to abut against the second portion of the flexible display, and wherein the pressing member is connected to the fixing member.

14. An electronic device comprising:

a slidable housing including a first housing and a second housing configured to move with respect to the first housing between a slide-in state and a slide-out state; and a flexible display disposed in the slidable housing, and including a first portion exposed to a front side of the slidable housing in the slide-out state and a second portion which is not exposed to the front side of the slidable housing in the slide-out state, wherein the first portion includes a plurality of layers including a window layer, a panel layer, and a bonding layer, wherein the second portion does not include at least one layer including the panel layer among the plurality of layers of the first portion and includes an adhesive layer distinct from the bonding layer in replacement of the at least one layer, and wherein the adhesive layer has a thickness corresponding to the removed at least one layer and is extended to an end of the flexible display.

15. The electronic device of claim 14, wherein the plurality of layers include a flexible substrate, the panel layer, a polarization layer, and the window layer.

16. The electronic device of claim 14, wherein the adhesive layer includes a plurality of slits spaced apart.

17. The electronic device of claim 14, wherein the adhesive layer included in the second portion is disposed under the window layer.

* * * * *